United States Patent
Song et al.

(10) Patent No.: US 11,804,261 B2
(45) Date of Patent: Oct. 31, 2023

(54) TERMINATION FOR SINGLE-ENDED MODE

(71) Applicant: Micron Technology, Inc., Boise, ID (US)

(72) Inventors: Keun Soo Song, Eagle, ID (US); Hyunyoo Lee, Boise, ID (US); Kang Yong Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/662,325

(22) Filed: May 6, 2022

(65) Prior Publication Data

US 2022/0358994 A1  Nov. 10, 2022

Related U.S. Application Data

(60) Provisional application No. 63/185,900, filed on May 7, 2021.

(51) Int. Cl.

| | |
|---|---|
| *G11C 11/4093* | (2006.01) |
| *G06F 13/40* | (2006.01) |
| *G11C 11/4076* | (2006.01) |
| *H03F 3/45* | (2006.01) |
| *H03K 19/00* | (2006.01) |

(52) U.S. Cl.
CPC ...... *G11C 11/4093* (2013.01); *G06F 13/4022* (2013.01); *G11C 11/4076* (2013.01); *H03F 3/45* (2013.01); *H03K 19/0005* (2013.01); *H03F 2203/45151* (2013.01)

(58) Field of Classification Search
CPC .......... G06F 13/4022; G11C 11/4093; G11C 11/4076; G11C 7/02; G11C 7/222; G11C 29/028; H03F 3/45; H03F 1/26; H03F 3/45475; H03F 2203/45151; H03K 19/0005; Y02D 10/00
USPC ........................................................ 710/316
See application file for complete search history.

(56) References Cited

U.S. PATENT DOCUMENTS

| | | | |
|---|---|---|---|
| 5,528,168 A * | 6/1996 | Kleveland | H04L 25/0292 |
| | | | 326/86 |
| 9,838,029 B1 | 12/2017 | Gao | |
| 2017/0103032 A1 | 4/2017 | Amreich | |

(Continued)

OTHER PUBLICATIONS

"International Search Report and Written Opinion", Application No. PCT/US2022/072191, dated Sep. 15, 2022, 11 pages.

*Primary Examiner* — Chun Kuan Lee
(74) *Attorney, Agent, or Firm* — Colby Nipper PLLC

(57) ABSTRACT

This document describes apparatuses and techniques for termination for single-ended (SE) mode operation of a memory device. In various aspects, a termination circuit can terminate an unused signal line of a differential pair to a ground or power rail using a switch element when operating in the SE mode. The termination circuit may also disconnect the unused signal line from a first input of a differential amplifier and connect a reference voltage to the first input of the differential amplifier. Based on the reference voltage, the differential amplifier amplifies an SE signal received using another signal line of the differential pair at a second input of the differential amplifier to provide a clock signal for memory operations. Thus, the termination circuit may reduce an amount by which noise associated with the unused signal line affects the differential amplifier when the memory device operates in SE mode.

41 Claims, 9 Drawing Sheets

(56) References Cited

U.S. PATENT DOCUMENTS

| | | |
|---|---|---|
| 2019/0266121 A1 | 8/2019 | Kuehlwein et al. |
| 2020/0352471 A1* | 11/2020 | Kim .................. H03M 1/124 |
| 2020/0402563 A1 | 12/2020 | Guo et al. |
| 2021/0034178 A1 | 2/2021 | Jiang |

* cited by examiner

TERMINATION FOR SINGLE-ENDED MODE

RELATED APPLICATION(S)

This application claims priority to U.S. Provisional Patent Application Ser. No. 63/185,900, filed on May 7, 2021, the disclosure of which is incorporated by reference herein in its entirety.

BACKGROUND

Computers, smartphones, and other electronic devices operate using processors and memories. A processor enables a user to run applications and programs by executing a set of instructions that process data. Generally, the processor obtains the set of instructions and data from a memory that stores this information. Demands on memory devices continue to evolve and grow. Advances in processors, however, have often outpaced those of memory. As a result, execution speeds associated with these applications and features are often limited by the speed of memories. Applications on electronic devices may also operate on ever-larger data sets that require ever-larger memories. Further, manufacturers of memories or electronic devices may face demands for faster execution speeds of memories while also enabling power conservation of an electronic device. Accommodating these various demands results in numerous signal integrity requirements for clock and data lines to ensure the accurate storing and retrieval of data by memories.

BRIEF DESCRIPTION OF THE DRAWINGS

Apparatuses of and techniques for terminating a clock line for single-ended (SE) mode operations of a memory clock circuit are described with reference to the following drawings. The same numbers are used throughout the drawings to reference like features and components.

DETAILED DESCRIPTION

Overview

Figure 1:
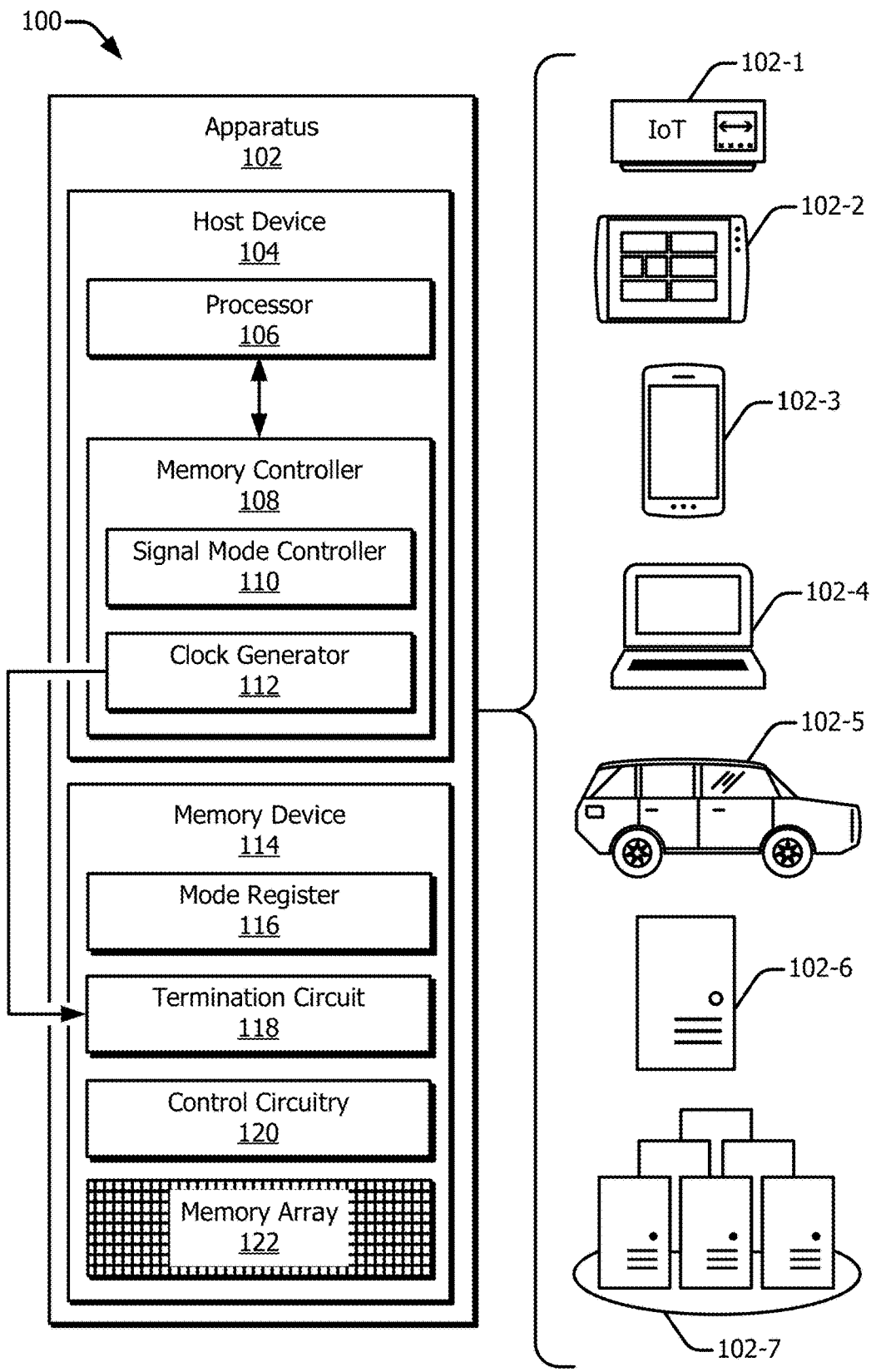
FIG. 1 illustrates an apparatus in which aspects for termination for SE mode operation can be implemented for a memory system.

Computers, smartphones, and other electronic devices operate using processors and memories to run a variety of programs and applications, ranging from low-power operating systems and background utilities to computationally intensive applications for high-resolution graphics, computational simulations, artificial intelligence (AI), deoxyribonucleic acid (DNA) research, and so forth. Execution speeds associated with these programs and applications are often related to the performance of a memory of the device, which is contingent, in part, on a speed of clock signals (e.g., the repetition of high and low voltage signals) used to enable and coordinate operation of the memory.

By way of review, some memory devices operate based on clock signals implemented with a single-ended (SE) mode of signaling. In an SE mode of signaling, a memory device receives a single clock line that periodically transitions between a high and a low voltage level over time (e.g., an approximate square wave). Based on the transitioning voltage level of the SE mode clock signal, the memory device synchronizes various memory operations to transfer data to and from the memory device. While an SE mode of operation generally consumes a lower amount of power to support memory operations, overall data transfer performance may be limited by a maximum rate at which the SE mode clock signal rises and falls (e.g., slew rate) over a clock line of a memory bus. For example, if the clock signal periodically changes between 1.5 volts (V) and 0 V, it takes time to ramp up the voltage from 0 V to 1.5 V and additional time to lower the voltage down from 1.5 V to 0 V. Relative to an operating frequency of the clock signal, this ramp time can affect the data transfer rate of the memory, and thus limit the execution speed and performance of applications and features of an electronic device.

To increase data transfer rates, some memories operate with clock signals that use a differential mode of signaling. In the differential mode, a memory device may receive two complementary clock signals of opposite polarity and compare each signal against the other to generate a clock signal for the memory device. The differential mode of signaling enables each complementary clock signal to be driven at a lower voltage than the SE mode clock signal. In contrast to SE mode signaling, the lower voltage and differential receiver conditioning of the differential mode may enable higher data transfer rates, albeit with an increase in power consumption required to drive more than one clock signal. For example, the voltage of the first clock signal may vary from −0.25V to +0.25V, while the voltage of the second clock signal varies in opposition from +0.25V to −0.25V such that a total swing voltage across the two clock lines is 0.5V as received by the memory device. In comparison to the SE mode, the two clock lines operate at lower voltages with faster slew rates in differential mode, but driving these signals consumes more power of the electronic device.

To address these and other challenges of preceding memory technologies, this disclosure describes aspects of a high-impedance node termination for single-ended mode operation of memory devices. As described herein, a memory device may be configured to selectively operate clock circuitry in either a differential signaling mode or a single-ended mode (SE mode) of operation in accordance with various aspects of high-impedance node termination. For example, an electronic device may include a memory device (e.g., a low-power double data rate (LPDDR)

memory device) that utilizes a differential mode of signaling to increase clock speeds for improved memory access performance, which in turn can support process-intensive applications. Alternatively, when the electronic device performs low-power operations or less complex tasks, the memory device can use an SE mode of signaling to conserve power (e.g., use fewer and/or lower frequency clock signals).

Generally, the differential mode and SE mode clock signals may operate over a same set of clock signal lines, which may enable the use of fewer clock lines or respective clock pins on a memory device or memory controller. Using the same clock signal lines for both modes, however, may introduce issues for circuits that are specifically configured for a differential mode or an SE mode of transmitting and/or receiving clock signals. For example, operation in the SE mode may terminate one of the differential mode clock lines at a high-impedance state or leave one of the differential mode clock lines unterminated. If a drive circuit is unable to provide a sufficient high-impedance termination state, the unused clock line may pick up noise or interference and carry it to a receive circuit of the memory clock system. For example, an inactive clock line of a differential pair (e.g., the second clock line) may generate noise due to electromagnetic interference, reflected currents, thermal noise, capacitive noise, and so forth while operating in the SE mode.

To address these and other issues associated with selective operation of a memory clock circuit, this document describes aspects of high-impedance node termination for single-ended mode operation of memory devices. Various aspects, example circuits, memory devices, and methods are described herein for terminating a high-impedance node for SE mode signaling operations to reduce noise disturbances of a clock receive circuit and improve clock signal recovery. In an example aspect, when operating in the SE mode, the described circuitry can terminate an unused clock line of a pair of clock lines to a ground reference or power rail using a termination circuit or features. In some cases, the termination circuit includes a termination resistor coupled in series with a switch that is collectively operable to couple (e.g., terminate) the signal line to the ground reference when the memory device is operating in the SE mode (e.g., signaling from internal logic or an external control of a memory controller). By terminating (e.g., grounding) the unused clock signal line, the termination circuit prevents noise from reaching the clock receive circuit. The termination circuit may include additional switches to decouple the unused clock signal line from the clock receive circuit and couple an input of the clock receive circuit to a stable voltage (e.g., a reference voltage) to provide a reference by which to enable reception of the SE mode clock signal received on another input of the clock receive circuit. Therefore, the termination circuit may reduce noise and improve the efficiency of the memory device while addressing needs for increased memory performance (e.g., in differential mode) and power-saving techniques (e.g., in SE mode). Other examples of high-impedance node terminations for SE mode operation of a memory device are described within this disclosure.

Example Operating Environments

FIG. 1 illustrates at 100 an apparatus 102 in which aspects of high-impedance node termination for SE mode can be implemented. The apparatus 102 can include, for example, an internet-of-things (IoT) device 102-1, tablet device 102-2, smartphone 102-3, notebook computer 102-4, an automobile 102-5, server computer 102-6, server cluster 102-7 that may be part of cloud computing infrastructure or a data center, or a portion thereof (e.g., a printed circuit board (PCB)). Other examples of the apparatus 102 include a wearable device (e.g., a smartwatch or intelligent glasses), entertainment device (e.g., a set-top box, video dongle, smart television, a gaming device), desktop computer, motherboard, server blade, consumer appliance, public transportation device, drone, industrial equipment, security device, sensor, or an electronic component thereof. These example apparatus configurations can include one or more components to provide various computing functionalities, data processing, and/or features.

In the example implementations shown at 100, the apparatus 102 may include a host device 104 with at least one processor 106 and at least one memory controller 108. The apparatus 102 can be implemented in various manners with more, fewer, or different components. For example, the host device 104 may include multiple cache memories (e.g., including multiple levels of cache memory) associated with the processor 106 and/or the memory controller 108 or no cache memory. In other implementations, the host device 104 may omit the processor 106 or the memory controller 108. In addition to one or more cache memories, the host device 104 can include additional components to form a system-on-a-chip (SoC).

The processor 106 may be implemented as any suitable type of processor, which may include a general-purpose processor, one or more processing cores, a central processing unit (CPU), a graphics processing unit (GPU), a neural network engine or accelerator, an application-specific integrated circuit (ASIC), a field-programmable gate array (FPGA) integrated circuit (IC), a communications processor (e.g., a modem or baseband processor), or the like. In operation, the memory controller 108 can provide a high-level or logical interface between the processor 106 and at least one memory (e.g., a memory array or external memory) that is coupled to the host device 104 using a respective interconnect. The memory controller 108 can, for example, receive memory requests from the processor 106 and provide the memory requests to a memory array with appropriate formatting, timing, and reordering in accordance with a memory access protocol or specification (e.g., protocols of a Low-Power Double Data Rate 5 (LPDDR5)). The memory controller 108 can also forward memory responses received from the memory array to the processor 106.

The memory controller 108 depicted in 100 includes a signal mode controller 110 that controls a mode of signaling (e.g., SE or differential signaling) of a memory that is coupled with a clock generator 112 of the memory controller 108. The memory controller 108 can receive triggers, instructions, or indications from the processor 106 to select a signaling mode by which to operate a memory device 114 and/or to transmit an indication of the selected signaling mode to the memory device 114. The memory device 114, which is coupled to the host device 104 using an interconnect (not shown), can be implemented as any suitable type of memory module, memory die, memory array, memory circuit, or the like. Examples of the memory device 114 include a DRAM die or module (e.g., an LPDDR synchronous DRAM (SDRAM)). The DRAM die or module can include a three-dimensional (3D) stacked DRAM device, a high-bandwidth memory (HBM) device, or a hybrid memory cube (HMC) device. In general, there are multiple types of DRAM. As one example, a low-power double data rate (DDR) memory, also referred to as LPDDR or mobile DDR, is a DDR SDRAM. LPDDR generally uses less power than other types of DDR SDRAM. In some applications, LPDDR memory may also be configurable to operate in differential or SE signaling modes for scalable performance to support applications or memory access profiles that range from low-power, moderate, or memory intensive. Device manufacturers often use LPDDR memory in mobile devices, such as smartphones and tablet computers, to provide efficient memory operations or extend battery runtimes. Cloud and web-services companies increasingly use LPDDR memories in server applications to reduce electricity usage and, therefore, lower operational costs across large data centers.

While the signal mode controller 110 depicted in 100 is part of the host device 104, in general, it can be implemented as a component of the apparatus 102 or the memory device 114. The processor 106 can send instructions to the signal mode controller 110 to operate the memory device 114 using a specified mode of signaling. The signal mode controller 110 can determine and transmit instructions to a mode register 116 of the memory device 114. These instructions can include one or more binary digits (bits) or a voltage level used to control logical operations of a clock termination circuit (e.g., termination circuit 118). These instructions from the mode register 116 can include mode register write (MRW) commands used to control one or more elements (e.g., switches, resistors) of the termination circuit 118. In aspects, the termination circuit 118 uses one or more termination features to reduce electronic noise and improve operations of a memory (e.g., the memory device 114). For a low-power DRAM (LPDRAM), for instance, the termination circuit 118 can be controlled by MRW commands or signals that include an operating state of one or more resistors (e.g., termination resistors), a resistance strength of a variable resistor, a frequency of the mode of signaling (e.g., low or high), an operating state of an always-on mode, an operating state of a leveling mode, a frequency ratio of signals, and so forth.

By way of example, consider Table 1 below of MRW commands used to configure various implementations of the termination circuit 118, which may terminate either lines of a clock, command, address, or data interface between a memory controller 108 and a memory device 114. Table 1 lists features of the termination circuit 118, including a true write clock (WCK_t) on-die termination (ODT) and a complementary write clock (WCK_c) ODT that are coupled, respectively, to signal lines used to transmit WCK_t and WCK_c signals of a "write only" register type. WCK_t and WCK_c can each be assigned 3 bits (e.g., an array of [0:2] for WCK_t ODT and an array of [3:5] for WCK_c ODT) to control an operational state or resistance strength of each ODT. In Table 1, a bit array of [000] in the [0:2] position, for instance, can disable the WCK_t ODT, and a bit array of [000] in the [3:5] position can disable the WCK_c ODT. The variable resistance (RZQ) is shown in Table 1 as having 6 possible preset strengths, though in general, each RZQ can have more or fewer possible strengths.

TABLE 1

MRW Commands for Write Clock True and Complement Signal Termination Settings

| Feature | Register Type | Operand | Data |
|---------|---------------|---------|------|
| WCK_t ODT | Write only | OP[0:2] | $000_B$: ODT disable (default)<br>$001_B$: RZQ/1<br>$010_B$: RZQ/2<br>$011_B$: RZQ/3 |

TABLE 1-continued

MRW Commands for Write Clock True and Complement Signal Termination Settings

| Feature | Register Type | Operand | Data |
|---------|---------------|---------|------|
| | | | $100_B$: RZQ/4<br>$101_B$: RZQ/5<br>$110_B$: RZQ/6<br>$111_B$: reserved for future use |
| WCK_c ODT | | OP[3:5] | $000_B$: ODT disable (default)<br>$001_B$: RZQ/1<br>$010_B$: RZQ/2<br>$011_B$: RZQ/3<br>$100_B$: RZQ/4<br>$101_B$: RZQ/5<br>$110_B$: RZQ/6<br>$111_B$: reserved for future use |

The memory device 114 can also perform operations to, for example, communicate with other devices, manage memory performance, and perform memory read or write operations using various components of a control circuitry 120 and/or the termination circuit 118. Though not depicted in FIG. 1, the control circuitry 120 can include, for example, one or more registers, array control logic, clock circuitry, and so forth. The control circuitry 120 can also synchronize various memory components with one or more clock signals received from the memory controller, including a clock (CK) signal (e.g., a true CK (CK_t) or a complementary CK (CK_c)) or a WCK signal (e.g., WCK_t or WCK_c). The control circuitry 120 can additionally use an internal clock signal to synchronize memory components. The CK and/or WCK signals can be used to set a transfer rate of a command and address (CA) signal and a rate at which data (DQ) and data strobes (DQS) are transferred between a host device and the memory device 114. For example, an LPDDR5 compliant memory device 114 can transfer DQ data at speeds of up to 6400 megabits per second (Mbps).

The termination circuit 118 can receive signals (e.g., CK and/or WCK signals) generated by the clock generator 112, as shown at 100. These signals can include respective clock and data signals of time-varying voltages used to enable transfers of data to and from a memory array 122 of the memory device 114. Though not depicted, the termination circuit 118 can be implemented separately from the memory device 114 and/or as a component of either the host device 104 or the apparatus 102. For example, a termination circuit 118 implemented in the memory controller 108 can receive read data strobe (RDQS) signals generated by the memory device 114 for use in synchronizing and clocking data read from the memory device 114. For example, the termination circuit 118 of the memory controller 108 can receive RDQS signals from a DRAM using the aspects described herein to provide a clock signal to internal logic for receiving and decoding data responses received from a memory device 114 over a DQ bus of the interconnect.

The memory array 122 of the memory device 114 can include any suitable type or configuration of memory cells, including but not limited to memory cells of DRAM, SDRAM, 3D-stacked DRAM, DDR memory, LPDRAM, or LPDDR SDRAM. For example, the memory array 122 can include memory cells of SDRAM configured as a memory module with one channel containing either 16 or 8 DQ signals, double-data-rate input/output (I/O) signaling, and support for a supply voltage. The density of the memory device 114 can range, for instance, from 2 gigabits (Gb) to 32 Gb. The memory array 122 and the control circuitry 120 may be components of a single semiconductor die or separate semiconductor dies. In some cases, the memory array 122 or the control circuitry 120 are distributed across multiple dies of the memory device 114.

The host device 104 can be operatively coupled, using an interconnect (not shown) of the apparatus 102, to a cache memory (not shown), which may be operatively coupled to the memory device 114. As shown in this example, the memory device 114 is connected to the host device 104 using the interconnect without an intervening buffer or cache. The memory device 114 may also operatively couple to a storage memory (not shown) of the apparatus 102. The storage memory can include, for example, a storage-class memory device (e.g., a flash memory, hard disk drive, solid-state drive, phase-change memory (PCM), or memory employing 3D XPoint™). The host device 104 can be coupled, directly or indirectly using the interconnect, to the memory device 114 and a storage memory. This interconnect can transfer data between two or more components of the apparatus 102. Examples of the interconnects include a bus, switching fabric, and one or more signal lines that carry voltage or current signals. Though not illustrated, an interconnect can include at least one command/address (CA) bus and at least one data (DQ) bus. Each bus may be a unidirectional or a bidirectional bus. In some implementations, an interconnect may also include a chip-select (CS) I/O that can, for example, couple to one or more CS pins of the memory device 114. An interconnect may also include a CK bus that is part of or separate from the CA bus.

The memory device 114 may have an "internal" or "local" cache memory for storing or buffering data for read and/or write operations. In some cases, the host device 104 and the memory device 114 can be disposed on, or physically supported by, a PCB (e.g., a rigid or flexible motherboard). The host device 104 and the memory device 114 may additionally be integrated on an IC or fabricated on separate ICs packaged together. The memory device 114 may also be coupled to multiple host devices 104 using one or more interconnects and may respond to memory requests from two or more host devices 104. Each host device 104 may include a respective memory controller 108, or the multiple host devices 104 may share a memory controller 108.

In an example, the apparatus 102 (e.g., a computer) receives user input to run high-resolution simulations associated with a large amount of data, which are computationally and data-intensive applications. Based on the expected workload of the processor 106 and memory device 114 of the apparatus 102, the apparatus instructs the host device 104 (e.g., an SoC) to communicate with the memory device 114 (e.g., a DRAM) to increase a memory clock rate to increase memory bandwidth to improve performance time of the simulations. The SoC uses the processor 106 (e.g., a CPU and/or a power profile controller) to instruct the memory controller 108 to operate in the differential mode of signaling to increase memory bandwidth or access performance. In particular, the memory controller 108 configures (e.g., using corresponding MRW commands) the clock generator 112 to operate in a differential clock signaling mode, which includes generating WCK_t and WCK_c signals for transmission to the clock termination circuit 118 of the memory device 114. The memory controller 108 also configures the signal mode controller 110 for differential operation and transmits instructions (e.g., threshold voltages, logical values) for a differential mode of signaling to the memory device 114. These instructions are received by the mode register 116 of the memory device 114, which determines one or more control signals (e.g., using one or more bits) to control one or more circuit elements (e.g., switches, resistors) of the termination circuit 118.

In the context of the present example, after the apparatus 102 (e.g., the computer) completes the high-resolution simulations, the computer receives user input to perform generic processing tasks that require a small amount of data (e.g., simulation analysis applications). In this case, the apparatus 102 instructs the host device 104 to reduce the memory clock rate to conserve power of the computer. The host device 104 uses the processor 106 (e.g., a power profile controller or utility) to instruct the memory controller 108 to operate in the SE mode of signaling to conserve power. In particular, the memory controller 108 configures the clock generator 112 (e.g., using corresponding MRW commands) to generate WCK_t signals in an SE mode for transmission to the clock termination circuit 118 of the memory device 114. Note here that the WCK_c signal line is not active, and the clock generator 112 may attempt to drive this signal line into a high-impedance state. The signal mode controller 110 also configures the memory device 114 to operate in the SE mode of signaling, for instance, by issuing corresponding MRW commands to the memory device 114. The commands received by the mode register 116 are used to generate one or more control signals to configure one or more circuit elements of the termination circuit 118 for termination of the high-impedance node (e.g., the unused clock signal line WCK_c). Generally, at least some of these control signals are used, in part, to drive a high-impedance node into a valid level using a termination feature of the termination circuit 118 as described herein.

While the host device 104 (e.g., the SoC) of this example determines a preferred mode of signaling, the mode of signaling can also be determined or selected by the memory device 114 (e.g., the DRAM). Though the example memory device 114 is reconfigurable between the SE mode and the differential mode of signaling, in general, the circuits and methods described herein can also be applied to a memory controller 108 (e.g., for RDQS clocking) that is capable of either differential mode operation and/or SE mode operation on various clock, command, address, or data lines. The termination circuit 118 of the memory device 114 is further described with respect to FIG. 2 and throughout this disclosure.

Figure 2:
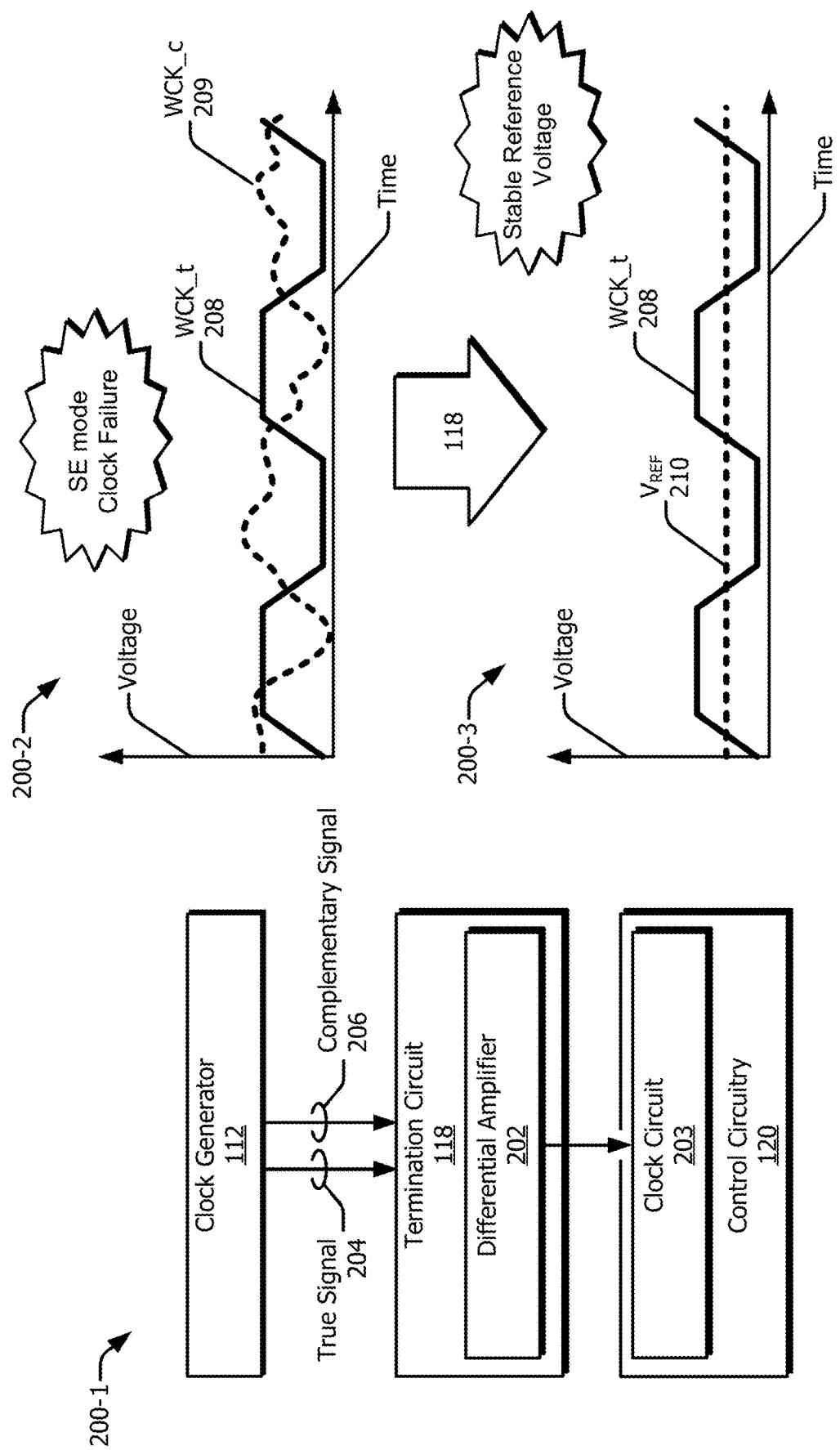
FIG. 2 illustrates an example configuration of a clock signal termination circuit that can be implemented in a host device, memory controller, or memory device in accordance with one or more aspects.

FIG. 2 illustrates an example configuration of a clock signal termination circuit that can be implemented in a host device, memory controller, or memory device in accordance with various aspects of high-impedance node termination for single-ended mode operation of memory devices. Generally, the termination circuit 118 may enable termination of a high-impedance node or signal line of a memory clock circuit, which may reduce or prevent noise from reaching a receive amplifier or buffer of the memory clock circuit. As shown at 200-1, an example implementation of the termination circuit 118 includes a differential amplifier 202 (e.g., input buffer, receive amplifier) that is configured to receive clock signals from a memory controller and provide a clock signal to a clock circuit 203 of the control circuitry 120 of the memory device 114 to enable memory access operations. As described herein, the memory device 114, and more specifically the differential amplifier 202, supports differential mode operation and SE mode operation by receiving clock signals from the host device 104.

For example, as shown at 200-2, when operating in the differential mode, the clock generator 112 of the memory controller 108 can transmit a true signal 204 (e.g., WCK_t) using a first signal line and a complementary signal 206 (e.g., WCK_c) using a second signal line, which together form a differential pair of clock signals. When operating in the SE mode, the clock generator 112, instead, transmits a WCK_t 208 signal using the first signal line and refrains from transmitting a WCK_c signal 209. In the context of preceding circuits that lack aspects of high-impedance node termination, as shown at 200-2, a differential amplifier 202 may use the unterminated, and thus unstable, WCK_c signal 209 as a reference level when receiving the SE mode WCK_t signal 208, resulting in clock detection or sense failure by the differential amplifier 202. In other words, due to the inability of a memory controller to drive the WCK_c signal 209 to a high-impedance state with sufficient strength, the WCK_c signal 209 may float, vary, and/or acquire noise or interference that is transferred to the input of the differential amplifier 202 of preceding circuits, which can result in SE mode clock failure (e.g., inability to detect or recover the SE mode clock signal).

In contrast with preceding circuits, the described aspects of high-impedance node termination enable a termination circuit 218 that can terminate an unused signal line, decouple the unused signal line from active memory circuitry, and/or provide a suitable reference voltage to an input of a differential amplifier 202 as depicted at 200-3. Thus, when implemented with a termination circuit 118 as described herein, the termination circuit 118 can decouple a WCK_c signal line (e.g., used to transport WCK_c signals 209) from the differential amplifier 202, terminate the WCK_c signal line to a ground reference, and couple a reference voltage node to the input of the differential amplifier 202 to provide a reference voltage 210 ($V_{REF}$ 210) by which to receive the SE mode WCK_t signals 208. As such, the termination circuit 118 described herein can reduce or prevent noise associated with the unused WCK_c signal line from interfering with operations of the differential amplifier 202 as depicted in example plot 200-3 to improve performance of the memory device 114 when operating in the SE mode. In aspects, the termination circuit 118 may be implemented in association with any component, circuit, or device that operates in an SE mode. In other words, the termination circuit 118 and aspects described are not limited to applications of a memory device (e.g., 114) and can be used by or as a component of electronic devices that utilize either SE mode signaling or a combination of SE mode and differential mode signaling. For example, the termination circuit 118 can be used to reduce noise and improve signal or clock recovery of various logic circuits, video interfaces, network interfaces, storage interfaces, peripheral connections, and so forth.

Returning to 200-1, the clock generator 112 is depicted as generally transmitting a true signal 204 and/or a complementary signal 206 from the clock generator 112 to a receiving circuit of a memory device 114. With reference to a write clock of a memory system, the true signal 204 can include a WCK_t signal that supports operations of the differential mode and SE mode (e.g., WCK_t signals 208 at 200-3). The complementary signal 206 can include a WCK_c signal that supports operations of the differential mode and SE mode (e.g., undriven or driven instead of WCK_t). In aspects, the true signal 204 and complementary signal 206 may also represent other clock signals or clock circuits of a memory system. For example, the true signal 204 and complementary signal 206 may be implemented as CK_t and CK_c signals, respectively, that are transmitted from a memory device 108 to a memory device 114. The true signal 204 and complementary signal 206 may also be implemented as a true RDQS (RDQS_t) and a complement RDQS (RDSQ_c) signal, respectively, which are transmitted from a memory device 114 to a memory controller 108. Alternatively or additionally, the described clock generator 112 can be implemented on a memory device 114, and the described termination circuit 118 and associated features can be implemented on a memory controller 108 or host device 104 in accordance with one or more aspects. The various configurations and implementations of the termination circuit 118 are further described with respect to FIG. 3.

Example Circuit

Figure 3:
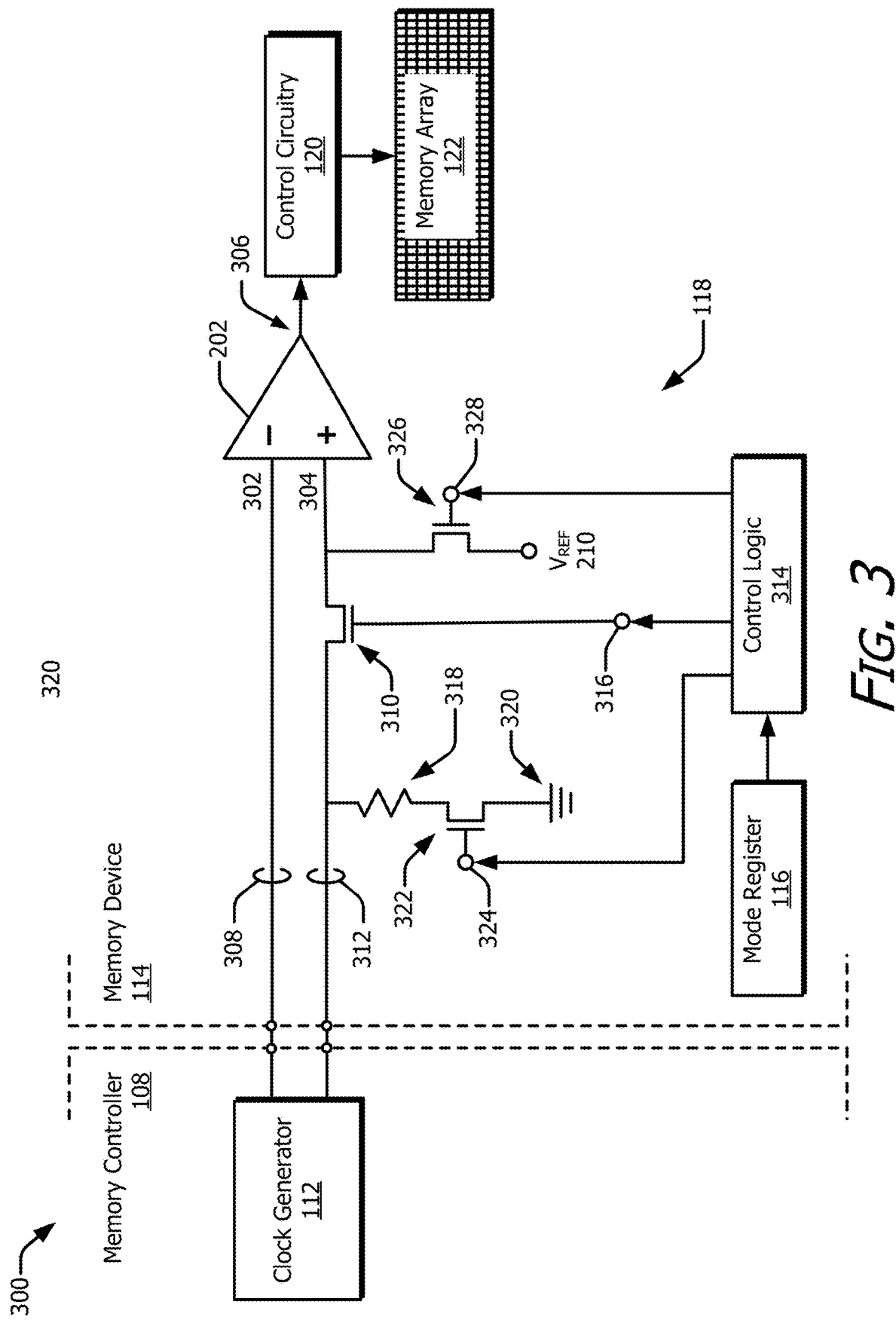
FIG. 3 illustrates an example termination circuit that can reduce noise associated with SE mode signaling of the memory device.

FIG. 3 illustrates an example termination circuit 118 that can reduce noise associated with SE mode signaling of the memory device 114. In aspects, the termination circuit 118 can mitigate or prevent noise, associated with SE mode signaling, from interfering with operations of the memory device 114. In this example, the termination circuit 118 includes the differential amplifier 202 (e.g., an input buffer), which has a first input 302 and a second input 304. The first input 302 and/or the second input 304 can receive differential or SE mode clock signals transmitted by the clock generator 112 of the memory controller 108. Generally, the differential amplifier 202 compares the voltage received at the first input 302 to the voltage received at the second input 304 and amplifies a voltage difference to provide an output signal at the output 306, which may be coupled to the control circuitry 120 of the memory array 122. The memory device 114 is not restricted to the configuration depicted in 300, and though not depicted, there may be additional components (e.g., a CA bus to enable read or write operations) based on the voltage difference that has been transmitted to the control circuitry 120. Furthermore, the differential amplifier 202 may be implemented as an input buffer, a receive amplifier, and so forth.

The termination circuit 118, which may be referred to as a clock termination circuit, may include a first signal line 308 (e.g., a first signal line of a differential pair) that is coupled to the first input 302 of the differential amplifier 202. The termination circuit of 300 also includes a first switch 310 or transmission gate that couples a second signal line 312 (e.g., a second signal line of the differential pair) to the second input 304 of the differential amplifier 202. As described herein, the first signal line 308 and the second signal line 312 enable transmission of various clock signals (e.g., CK, WCK, or RDQS signals), which enable the memory controller 108 and memory device 114 to access (e.g., write or read) data of the memory array 122. In general, the first signal line 308 and the second signal line 312 can enable transmission of any signal that is transmitted using the SE mode and is not limited to WCK signals. Both the first signal line 308 and the second signal line 312, as depicted in 300, carry signals generated by the clock generator 112 of the memory controller 108. The first signal line 308 and/or the second signal line 312 can include any suitable type of conductor, such as a wire, transmission line, PCB trace, a metal-etched conductor, coaxial line, flexible circuit line, and so forth to communicate signals from one location to another location at least partially within the apparatus 102.

As shown at 300, the first switch 310 is operable to couple the second signal line 312 to or decouple the second signal line 312 from the second input 304 of the differential amplifier 202. In the context of this disclosure, any of the switches described herein, including the first switch 310, may include a transmission gate, a field-effect transistor (FET), a pass-FET, a metal-oxide-semiconductor FET (MOSFET) device, a complementary metal-oxide semiconductor (CMOS) device, pass-transistor logic, and so forth. Alternatively or additionally, a switch can be implemented in combination with one or more resistors, diodes, or transistors in any combination (e.g., parallel or series) to control an application of voltage and/or a flow of current in the termination circuit 118.

In aspects, the first switch 310 can be activated (or deactivated) by a control signal (e.g., a threshold voltage) to open or close, thereby controlling, in part, the flow of current or voltage through the termination circuit 118. As shown in the example circuit of FIG. 3, the mode register 116 of the memory device 114 configures and/or sets various control lines through control logic 314, by which the mode register 116 controls components or operation of the termination circuit 118. Thus, the control logic 314 may generate or change a logical attribute of one or more control signals prior to transmitting the control signals to respective components of the termination circuit 118. For example, the mode register 116 can set a state or level of a first control line 316, using the control logic 314, for the first switch 310 to couple the second signal line 312 to or decouple the second signal line 312 from the differential amplifier 202. Thus, the mode register 116 can configure the control line 316 to open or close the first switch 310 based on a signaling mode of the memory device 114 as indicated by the mode register 116. In aspects, when the memory device 114 is operating in the SE mode, the control logic 314 deactivates the first switch 310 using control signals of the first control line 316 to decouple the second input 304 from the second signal line 312. Alternatively, when the memory device 114 is operating in the differential mode, the control logic 314 activates the first switch 310 using control signals of the first control line 316 to couple the second input 304 to the second signal line 312.

The termination circuit 118 also includes a first termination resistor 318 coupled between the second signal line 312 and a ground reference 320. In the implementation illustrated at 300, a first terminal of the first termination resistor is coupled to the second signal line 312 and a second terminal of the first termination resistor is coupled to a second switch 322, which can selectively couple the first termination resistor 318 to the ground reference 320. In other implementations, a switch 318 may be coupled from the second signal line 312 directly to the ground 320 or another reference node. The ground reference 320 is a reference point (e.g., a low potential reference) of the termination circuit 118 to which signals or noise can be terminated and may include, for example, an earth ground, a common ground, signal ground, a chassis ground, and so forth. The ground reference 320 can also be configured as a ground rail or in alternate configurations as a power rail. The termination circuit 118 can include multiple ground references which may be distinct or similar (e.g., electrically coupled or decoupled). In this disclosure, multiple instances of the ground reference 320 are electrically coupled to the same electrical ground.

The first termination resistor 318 and/or additional resistors described herein can include a fixed value resistor or a variable resistor of linear or nonlinear variable resistance. For example, the first termination resistor 318 may be implemented as a variable ODT resistor comprising a resistor and one or more transistors configured to provide a range of resistances between two terminals of the resistor. Alternatively, or additionally, each resistor described herein can include a laser-trimmed, polysilicon, carbon-composition, wire-wound, thin-film, carbon-film, metal-film, thick-film, metal-oxide, cermet-oxide resistor, or various combinations thereof. Thus, one or more resistors can also be distinct or similar in type, electrical resistance, resistance range, resistance steps/values, composition, configuration, or other parameters.

While the mode register 116 depicted in 300 transmits control signals (e.g., one or more bits) to each switch of the termination circuit 118, the mode register 116 can also transmit one or more bits to control one or more resistors (not shown) as described with respect to FIG. 1 (e.g., in accordance with Table 1). For example, the mode register 116 can be set with 3 bits to control the first termination resistor 318. A 3-bit combination of [000] can, for instance, disable the first termination resistor 318 and/or second switch 322 while other combinations can set a resistance strength at a predetermined value within a range of, for instance, 0-300 ohms ($\Omega$).

As shown at 300, the first termination resistor 318 is coupled in series with the second switch 322 between the second signal line 312 and the ground reference 320. The control logic 314 may use a control line 324 to provide a signal that activates or deactivates the second switch 322 to open or close the switch based on the control signal. For example, when the second switch 322 is activated or closed, signals or current can travel from the second signal line 312 to the ground reference 320 through the first termination resistor 318. Whereas, when the second switch 322 is deactivated or opened, the signals or current are prevented from traveling directly to the ground reference 320 through the first termination resistor 318. As described in this document, the first termination resistor 318 and the second switch 322 may be implemented as a termination feature to terminate an unused signal line to a ground reference or other reference. Alternatively or additionally, a termination feature may include another switch coupled directly between the second signal line 312 and the ground 320. For example, a 3-bit combination of [111], as controlled by the mode register 116, can bypass (e.g., via the other switch) the first termination resistor 318 (e.g., the variable ODT) to 0 $\Omega$ to effectively short the second signal line 312 to the ground reference 320 when operating in the SE mode.

In aspects, the termination circuit 118 also includes a third switch 326 coupled between the second input 304 of the differential amplifier 202 and a node at which a reference voltage, $V_{REF}$ 210, is provided or generated. The third switch 326 is operable to couple the $V_{REF}$ 210 to the second input 304 or decouple the $V_{REF}$ 210 from the second input 304 using control signals transmitted using a third control line 328. The $V_{REF}$ 210 can be held at a positive supply voltage (e.g., a common drain voltage (VDD) for logic) or a reference voltage (e.g., a common source voltage (VSS) for logic), or any voltage level in-between (e.g., one-half VDD). In general, the host device 104 (e.g., the SoC) or the memory device 114 (e.g., a DRAM) may use the mode register 116 and/or control logic 314 to selectively control the switches 310, 322, and/or 326 of the termination circuit.

In an example, the apparatus 102 receives user input to run high-resolution simulations associated with a large amount of data, requiring increased memory performance. As such, the memory controller 108 configures the clock generator 112 and the termination circuit 118 to operate in the differential mode. While operating in the differential mode, the termination circuit 118 receives a WCK_t signal using the first signal line 308 and a WCK_c signal using the second signal line 312 from the clock generator 112. The mode register 116 or control logic 314 generates control signals, based on the selected differential mode of signaling, for controlling the operations of the first switch 310, the second switch 322, and the third switch 326 using the first control line 316, the second control line 324, and the third control line 328, respectively. These control signals are generated by the mode register 116 and can be modified (e.g., independent from or similar to another control signal) by the control logic 314 to open or close each switch. In particular, the first switch 310 is activated to close, coupling the second signal line 312 to the second input 304 of the differential amplifier 202. The second switch 322 is deactivated to open, decoupling the first termination resistor of the second signal line 312 from the ground reference 320. The third switch 326 is also deactivated to open, decoupling the $V_{REF}$ 210 from the second input 304 of the differential amplifier 202. Thus, the WCK_t signal is received at the first input 302 of the differential amplifier 202, and the WCK_c signal is received at the second input 304. In this example, the first termination resistor 318 operated based on commands from the mode register 116 to provide an on-die termination for the WCK_c signal to the ground reference 320. Alternatively or additionally, the termination circuit 118 can also receive the WCK_t signals at the second input 304 and the WCK_c signals at the first input 302.

After the high-resolution simulations of this example are complete, the memory controller 108 receives an instruction or command (e.g., from an operating system of the host device 104) to operate in the SE mode to perform ordinary tasks that require a small amount of data. The memory controller 108 then configures the clock generator 112 and the termination circuit 118 to operate in the SE mode of signaling. For operation in the SE mode, the termination circuit 118 receives an SE version of the WCK_t signal (e.g., 208) using the first signal line 308. The mode register 116 or control logic 314 generates, based on the selected SE mode, signals at the first switch 310, the second switch 322, and the third switch 326 using the first control line 316, the second control line 324, and the third control line 328, respectively. The termination circuit 118, however, does not receive the WCK_c signals using the second signal line 312 but may receive residual current or voltage (e.g., electronic noise) that can affect the operation of the differential amplifier 202. Thus, in accordance with aspects of high-impedance node termination, the termination circuit 118 decouples the second signal line 312 from the second input 304 of the differential amplifier 202 and terminates, via the first termination resistor 318, the second signal line 312 to the ground reference 320 to mitigate and/or prevent the noise from reaching the differential amplifier 202 in the SE mode of operation. Specifically, the mode register 116 and/or control logic 314 perform operations to open the first switch 310 using the first control line 316 to decouple the second signal line 312 from the second input 304. The third switch 326 is activated to close using the third control line 328, coupling the $V_{REF}$ 210 to the second input 304. The second switch 322 is activated to close using the second control line 324, coupling the first termination resistor 318 of the second signal line 312 to the ground reference 320. By terminating the second signal line 312 (e.g., using the first termination resistor 318 and second switch 322 of the termination feature), at least some of the electronic noise or residual current can travel to the ground reference 320 to prevent disruption of WCK_t signals 208 and the $V_{REF}$ 210 at the differential amplifier 202. Thus, the SE-mode version of the WCK_t signal 208 is received at the first input 302 of the differential amplifier 202, and the $V_{REF}$ 210 is received at the second input 304. The $V_{REF}$ 210 can be held at any voltage level (e.g., amplitude) that is substantially static or stable over time. Alternatively, or additionally, the $V_{REF}$ 210 node can be coupled to one or more filters to reduce fluctuations in voltage over time. The one or more filters can be passive or active and include one or more capacitors, resistors, or inductors in any combination (e.g., in parallel or series).

In other aspects, when the termination circuit 118 does not include the termination feature (e.g., the second switch 322 and the first termination resistor 318), then the second signal line 312 terminates at the first switch 310. In this case, any current traveling along the second signal line 312 may encounter a discontinuity caused by an impedance mismatch at the first switch 310. This discontinuity can result in the reflection of current along the second signal line 312 that can travel back into the memory device 114 and/or memory controller 108, resulting in electronic noise. Alternatively, or in addition, any current traveling along the second signal line 312 can result in electromagnetic interference with signals transmitted using the first signal line 308 and/or the $V_{REF}$ 210. By coupling the second signal line 312 to the ground reference 320, electronic noise can be reduced to improve the performance of the memory device 114.

As shown at 300, the control lines 316, 324, and 328 are controlled by the mode register 116 and/or the control logic 314, although one or more of these signals may be coupled to or controlled by external logic (e.g., control signals). For example, these control signals may be generated responsive to one or more register settings received from a memory controller 108, an SoC, any host device 104, the apparatus 102, or the memory device 114. In general, the control signals of each control line can be similar or distinct to enable the techniques described herein. Any of the control signals can be independently or dependently configured or modified by the control logic 314 with respect to another control signal. In at least some aspects, the first control line 316 and the second control line 324 can be further modified as described with respect to FIG. 4.

Figure 4:
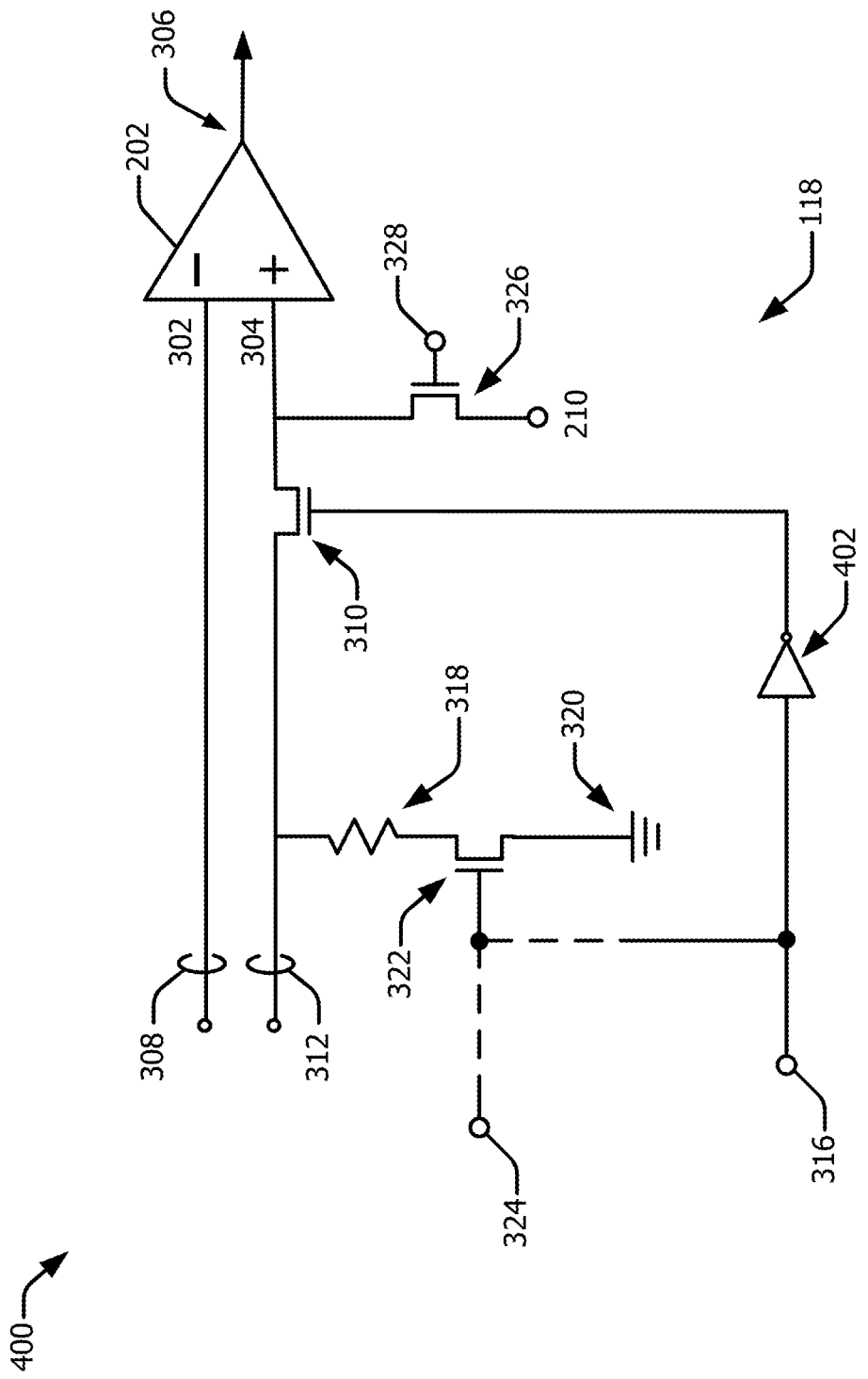
FIG. 4 illustrates example implementations of control circuitry for a first control line and a second control line of the termination circuit of FIG. 3.

FIG. 4 illustrates example implementations of control circuitry for a first control line and a second control line of the termination circuit of FIG. 3. In aspects, the termination circuit 118 shown at 400 is similar to the termination circuit of 300, with alternative implementations of control signals provided through the first control line 316, which may be modified by a first inverter 402 before activating or deactivating the first switch 310. Furthermore, the termination circuit of 400 may enable control of the second switch 322 by either an internal logic source or the second control line 324.

In this example, the first inverter 402 can perform logical negation of control signals to invert operational states (e.g., modify the control signals to enable a complement operation), which may be used to control other components of the termination circuit 118. As shown at 400, the first inverter 402 can utilize a Boolean function that assumes values of a two-element set (e.g., 1 and 0) to perform this logical negation. Here, a logical command of 1 can be used to open a switch, while a logical command of 0 can be used to close a switch. In this example, the inverter 402 can change a command of 1 to 0 or a command of 0 to 1, or logic high to logic low and vice versa. For the termination circuit 118, the logical commands of 1 and 0 can represent high and low voltage amplitudes, respectively, and are not limited to any specific voltage amplitude. The first inverter 402 can invert the logical representation of and change the voltage amplitude of control signals from the mode register 116 provided through the control logic 314.

In an example, the mode register 116 is set to configure the termination circuit 118 for operation in the differential mode of signaling. The mode register 116 transmits control signals, using the control logic 314, to the first control line 316, the second control line 324, and the third control line 328 to open each switch of the termination circuit shown at 400. In this example, the first control line 316 is decoupled from the second switch 322, and the second switch 322 receives control signals using the second control line 324. In particular, the termination circuit 118 receives a +3.3 V signal (e.g., a binary logical value of 1) using each control line to open the first switch 310, the second switch 322, and the third switch 326. The second switch 322 opens, decoupling the second signal line 312 from the ground reference 320, and the third switch 326 opens, decoupling the $V_{REF}$ 210 from the second input 304 of the differential amplifier 202. The first inverter 402, however, receives this +3.3 V signal and performs logical negation by outputting a 0 V signal (e.g., a binary logical value of 0). The first switch 310 is instructed to close, coupling the second signal line 312 to the second input 304 of the differential amplifier 202. Thus, the mode register 116 or other logic controls the termination circuit 118 by a set of control signals, which may be configured with any suitable logic or operating level of voltage (e.g., +3.3 V). For the termination circuit 118 described with reference to FIG. 3, however, the first control line 316 would need a separate control signal, e.g., set at a voltage of 0 V, to replicate the logical configuration shown at 400.

In the context of this example, the mode register 116 is then set to configure the termination circuit 118 for the SE mode. The mode register 116 transmits 0 V control signals, using the control logic 314, to each control line to close the first switch 310, the second switch 322, and the third switch 326. The second switch 322 closes, coupling the first termination resistor 318 of the second signal line 312 to the ground reference 320, and the third switch 326 closes, coupling the $V_{REF}$ 210 to the second input 304 of the differential amplifier 202. The first inverter 402, however, receives this 0 V control signal and performs logical negation by outputting a +3.3 V control signal. The first switch 310 is deactivated to open, decoupling the second signal line 312 from the second input 304 of the differential amplifier 202. In this example and the termination circuit described with reference to FIG. 3, the second switch 322 can be controlled by an external logic (e.g., provided by the SoC). Alternatively or additionally, the second switch 322 may be controlled by an internal logic of the memory device 114 or termination circuit 118 by coupling the first signal line 316 to the second switch 322 and decoupling the second control line 324 from the second switch 322 (shown with dashed lines in FIG. 4). Thus, in some implementations, the second control line 324 can be omitted from the termination circuit 118 (not shown).

In another example, the host device 104 configures the memory device 114 for operation in the differential mode. The signal mode controller 110, implemented on the host device 104 or the memory device 114, transmits control signals to the first control line 316 and the third control line 328 to open each switch of the termination circuit 118. In this example, the second switch 322 is coupled to the first control line 316, and the second control line 324 is either decoupled or omitted from the termination circuit 118 shown at 400. In contrast to the previous example, the second switch 322 is triggered to open using the first control line 316, decoupling the first termination resistor 318 of the second signal line 312 from the ground reference 320. When transitioning to operate in the SE mode, the signal mode controller 110 transmits, using the control logic 314, control signals using each control line to close the first switch 310, the second switch 322, and the third switch 326. In contrast to the previous example, the second switch 322 is triggered to close, using the first control line 316, coupling the first termination resistor 318 of the second signal line 312 to the ground reference 320. Additional switches and configurable resistors can be coupled to the $V_{REF}$ 210 as further described with respect to FIG. 5.

Figure 5:
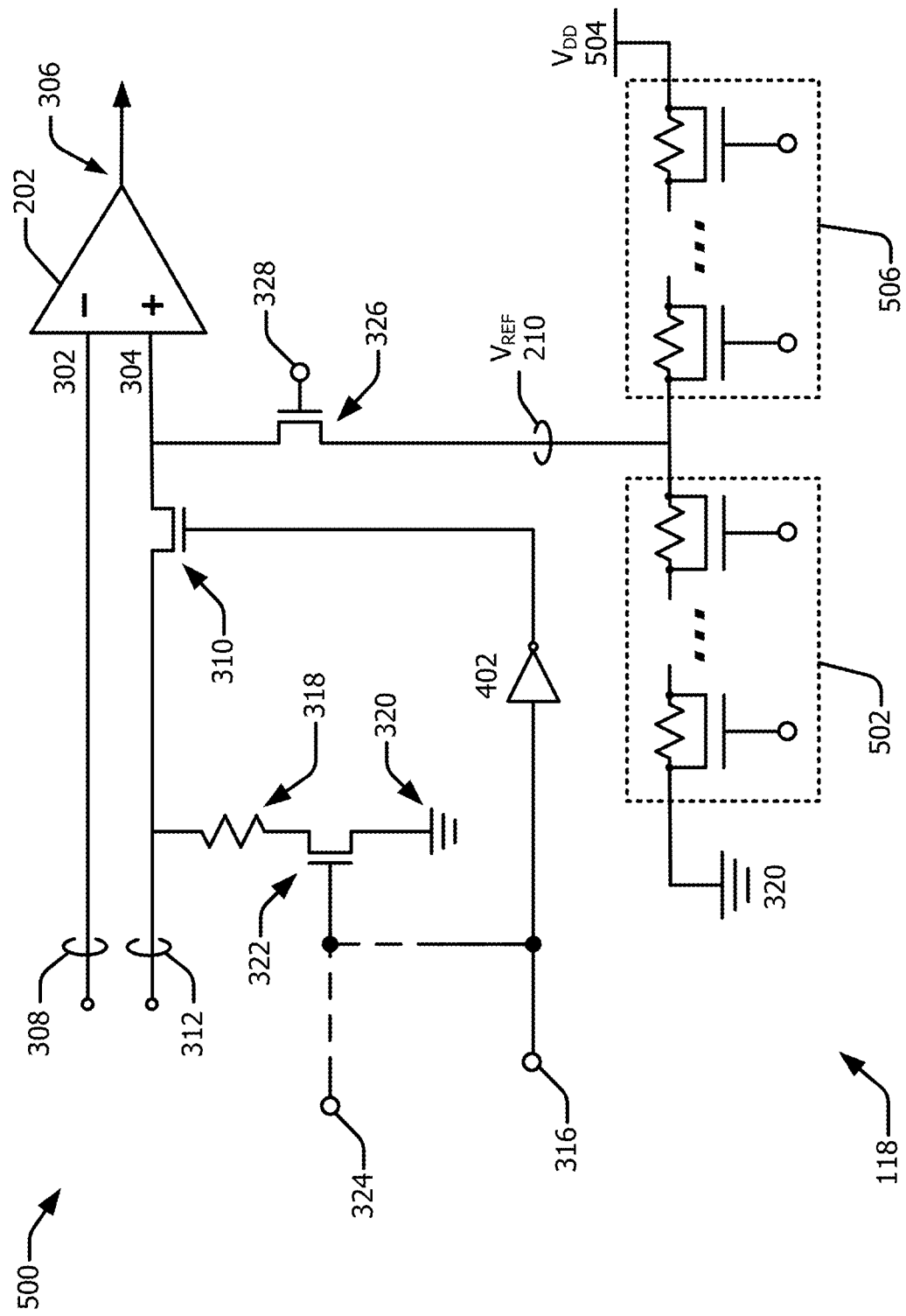
FIG. 5 illustrates another example of a termination circuit that includes a configurable reference voltage circuit in accordance with one or more aspects.

FIG. 5 illustrates another example of a termination circuit that includes a configurable reference voltage circuit in accordance with one or more aspects. In aspects, the termination circuit 118 may include a resistor divider or other variable circuitry to provide a configurable reference voltage (e.g., for SE mode operation). The termination circuit 118 shown at 500 may be implemented similar to those described with reference to FIGS. 1-4, with the addition of a configurable reference voltage 210.

In aspects, a reference voltage circuit of the termination circuit 118 includes at least one resistor that is coupled between the $V_{REF}$ 210 and the ground reference 320 and may be a configurable as a variable resistor. Additionally, at least one switch can be coupled in parallel with the at least one resistor coupled between the $V_{REF}$ 210 and the ground reference 320. As shown at 500, the at least one resistor and the at least one switch are shown collectively as a first resistor set 502. The first resistor set 502 can include one or more resistors and one or more switches (multiplicity shown with an ellipsis). Each switch can be coupled in parallel with a respective one or more of the resistors and can be triggered by control signals of mode register 116 as instructed by the host device 104 (e.g., the SoC) or the memory device 114 (e.g., a DRAM). Control signals used to open or close each switch of the first resistor set 502 can be similar or distinct from control signals used to open or close the first switch 310, the second switch 322, or the third switch 326. Furthermore, each switch of the first resistor set 502 can receive similar or distinct control signals when compared to another switch of the first resistor set 502. Each switch can include an inverter to perform logical negation of control signals (not shown).

The reference voltage circuit can also include at least one resistor coupled between the third switch 326 and a voltage rail or supply voltage (VDD) 504. Additionally, at least one switch can be coupled in parallel with the at least one resistor. As shown at 500, the at least one resistor and the at least one switch are shown collectively as a second resistor set 506. The second resistor set 506 can include one or more resistors and one or more switches (multiplicity shown with an ellipsis). Each switch can be coupled in parallel with a respective one or more of the resistors and can be triggered by control signals of the host device 104 (e.g., the SoC) or the memory device 114 (e.g., a DRAM). Control signals used to open or close each switch of the second resistor set 506 can be similar or distinct from control signals used to open or close the first switch 310, the second switch 322, the third switch 326, or each of the switches of the first resistor set 502. Furthermore, each switch of the second resistor set 506 can receive similar or distinct control signals when compared to another switch of the second resistor set 506. Each switch can include an inverter to perform logical negation of control signals (not shown). Thus, in aspects, the reference voltage circuit may operate as a configurable voltage divider to provide any suitable level of reference voltage (e.g., set at a value between VDD and either the ground reference or VSS) to the termination circuit 118. Alternatively, the reference voltage circuit may couple the reference voltage node 210 to either the ground reference or supply rail to provide a respective low or high level of voltage that the differential amplifier 202 may utilize when receiving SE mode clock signals.

In an example, the memory controller 108 configures the memory device 114 and the termination circuit 118 for operation in the SE mode. In addition to control signals transmitted to the first switch 310, the second switch 322, and the third switch 326 by the mode register 116, the mode register 116 opens respective switches of at least two resistors of the resistor sets 502 and 504 to provide a reference voltage 210 for the differential amplifier 202. In other words (assuming equal resistive values), the mode register 116 uses two resistors of the resistor set 502 and two resistors of the resistor set 506 to divide VDD by two. In this example, the mode register 116 enables transmission of a reference voltage of VDD/2 to the second input 304 of the differential amplifier 202 (e.g., FIG. 2 at 200-3) by transmitting control signals to close the third switch 326. Additional variations on the termination circuit and/or reference voltage circuit are described with respect to FIG. 6.

Figure 6:
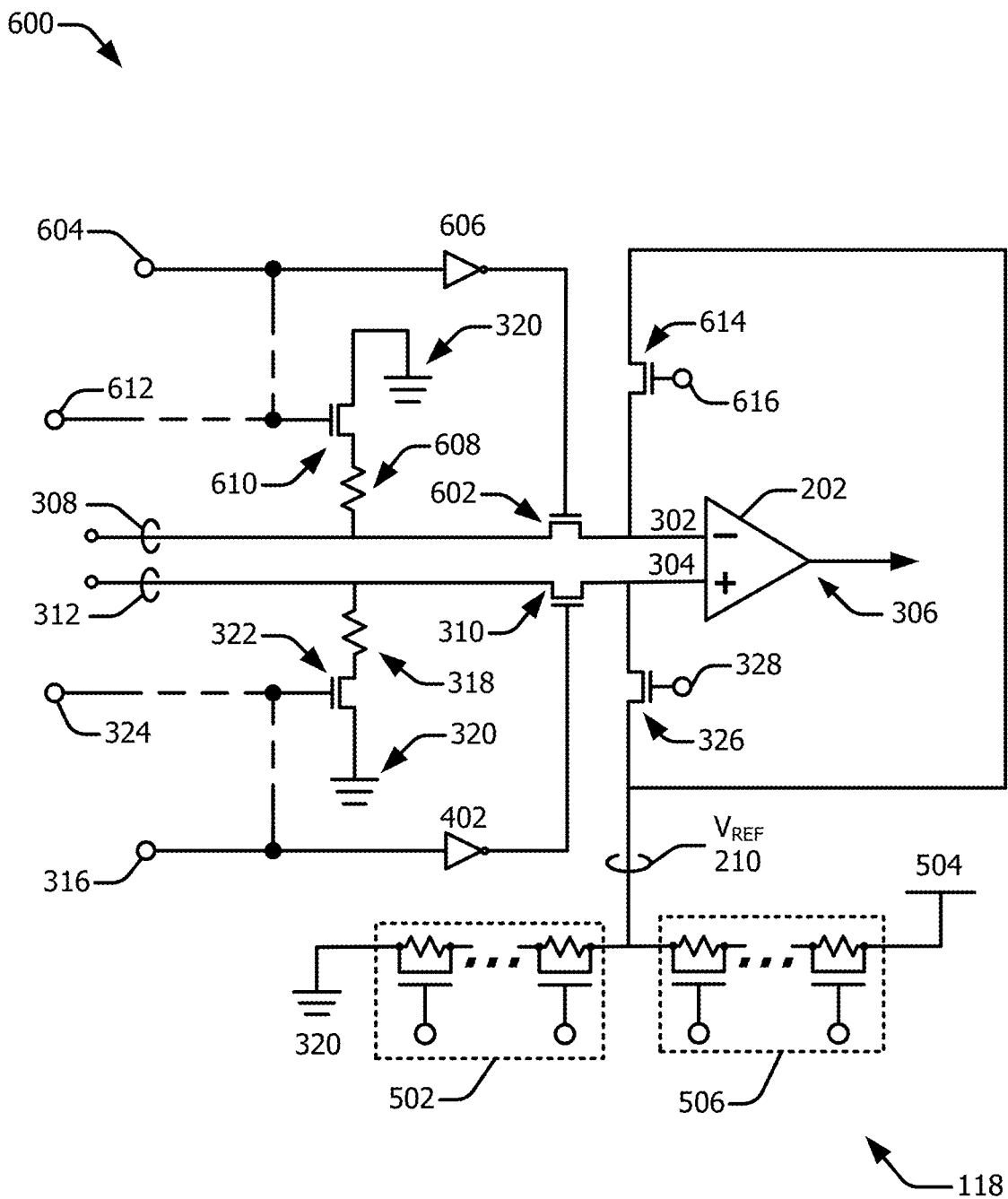
FIG. 6 illustrates an example of a termination circuit that provides functionality to terminate either signal line to the differential amplifier in accordance with one or more aspects.

FIG. 6 illustrates an example of a termination circuit that provides additional functionality to terminate either signal line to the differential amplifier in accordance with one or more aspects. Generally, the termination circuit 118 shown at 600 may be implemented similar to the termination circuits 118 described with reference to FIGS. 1-5. In this example, the termination circuit 118 includes a fourth switch 602 having a first terminal coupled to the first input 302 of the differential amplifier 202 and a second terminal coupled to the first signal line 308. A control terminal of the fourth switch 602 can be coupled to a fourth control line 604 such that the fourth switch 602 is operable to couple the first signal line 308 to the first input 302 of the differential amplifier 202 or decouple the first signal line 308 from the first input 302. In some implementations, the termination circuit 118 includes a second inverter 606 coupled between the fourth switch 602 and the fourth control line 604 to perform logical negation of control signals transmitted from the mode register 116, the control logic 314, or other signal source.

As shown at 600, the termination circuit 118 also includes a second termination resistor 608 coupled between the first signal line 308 and the ground reference 320. In this example, a first terminal of the second termination resistor 608 is coupled to the first signal line and a second terminal of the second termination resistor is coupled to a fifth switch 610. In general, the first termination resistor 318 and/or the second termination resistor 608 can be implemented as ODTs for differential signaling and/or used to reduce reflections (e.g., return currents) in each signal line. The termination circuit 118 also includes the fifth switch 610 coupled in series between the second termination resistor 608 and the ground reference 320. The fifth switch 610 is operable to couple the first signal line 308, via the second termination resistor 608, to the ground reference 320. The fifth switch 610 can open or close based on control signals received using a fifth control line 612. As described in this document, the second termination resistor 608 and the fifth switch 610 can collectively be considered a second termination feature. Although not shown, in alternate implementations, a termination feature may include another switch coupled directly between the first signal line 308 and the ground 320 (e.g., a switch coupled in parallel with an ODT between a signal line and ground). The termination circuit 118 shown in 600 also includes a sixth switch 614, which is operable to couple the first input 302 of the differential amplifier 202 to the reference voltage 210 of the reference voltage circuit using a sixth control line 616.

The mode register 116 can also be configured with one or more bits to control the second termination resistor 608 and/or switch 610. For example, a 3-bit combination of [000] can disable the second termination resistor 608, while other combinations can set a resistance strength at a predetermined value within a range of, for instance, 0-300 ohms (Ω). The mode register 116 may be configured such that the second termination resistor 608 is configurable using one or more bits that are distinct from the one or more bits received by the first termination resistor 318. In Table 1, a 3-bit array for the first termination resistor 318 can include bit positions of [0:2], while a 3-bit array for the second termination resistor 608 can include bit positions of [3:5] without overriding any values of positions [0:2]. Discussions herein will also include similar control signals for each control line (e.g., 316, 324, 328, 604, and 612). In general, however, the fifth control line 612 and the fourth control line 604 may receive similar or distinct control signals when compared with the first control line 316, the second control line 324, the third control line 328, or any control line of the first resistor set 502 or second resistor set 506. In aspects, the sixth switch 614 can be controlled to open or close using control signals transmitted using a sixth control line 616, which may receive control signals that are similar or distinct from any other control line of the termination circuit 118 shown in 600.

By way of example, the host device 104 or memory controller 108 configures the memory device 114 for operation in the differential mode. The signal mode controller 110 uses the mode register 116 and/or control logic 314 to generate respective control signals that are applied to the first switch 310, the second switch 322, the third switch 326, the fourth switch 602, fifth switch 610, and the sixth switch 614 of the termination circuit 118 of 600. Here, note that in the differential mode, the reference voltage 210 is not needed. Thus, control signals are transmitted to control lines 328 and 616 to open the third switch 326 and sixth switch 614 while decoupling the reference voltage circuit from the inputs of the differential amplifier 202. With respect to the differential signal lines (e.g., 308 and 312), the control logic 314 applies signals to control lines 316 and 604, that when inverted, close switches 310 and 602 to couple the differential signal lines 308 and 312 to respective inputs 302 and 304 of the differential amplifier 202. Either the internal/native control logic 314 or the external logic (e.g., memory controller 108) may use the control signals to open the switches 322 and 610 of the first and second termination features (optional control line configurations shown). Alternatively, or additionally, the mode register 116 may set the termination resistors 318 and 608 to a selected resistance for ODT of the differential signals by using, for instance, the bit value settings as described with reference to Table 1. In this example, the termination circuit does not short or ground either of the differential signal lines while operating in the differential mode.

As shown at 600, the termination circuit 118 can receive clock signals using either of the signal lines 308 or 312 when operating in the SE mode. Thus, the termination circuit 118 is selectively configurable to terminate either of the signal lines (e.g., 308 or 312) in accordance with aspects of high-impedance node termination for SE mode operation. In other words, the termination circuit 118 of FIG. 6 enables SE mode signaling using the second signal line 312 to receive an SE-mode version of the WCK_c signal 209. Similar to and with reference to the second signal line 312 of FIGS. 1-5, the first signal line 308 can be decoupled from the first input 302 of the differential amplifier 202 in the SE mode, using the fourth switch 602. Additionally, the V$_{REF}$ 210 can be coupled, using the sixth switch 614, to first input 302.

In an example, the host device 104 or memory controller 108 configure the memory device 114 for operation in the SE mode. The termination circuit 118 receives an SE version of the WCK_c signal using the second signal line 312, and the WCK_t signal of the first signal line 308 is left unused. In particular, the first switch 310 is activated to close, the second switch 322 is deactivated to open, and the third switch 326 is also deactivated to open, enabling the SE mode WCK_c signal to be received at the second input 304 of the differential amplifier 202. Furthermore, the fourth switch 602 is deactivated to open, the fifth switch 610 is activated to close, and the sixth switch 614 is activated to close, coupling the V$_{REF}$ 210 to the first input 302 of the differential amplifier 202. In this example, the fifth switch 610 couples at least some of the electronic noise associated with the unused first signal line 308 to the ground reference 320 to improve operations of the memory device 114 (e.g., writing data into the memory array 122). The termination features of 600 (e.g., including the second switch 322 and the fifth switch 610) can be controlled by the host device 104 (e.g., an SoC) or the memory device 114 (e.g., a DRAM). In aspects, the second termination resistor 608 of the second termination feature can also be controlled by an internal logic. As depicted in FIG. 6, the fifth control line 612 may be omitted or decoupled from the termination circuit 118 shown in 600, and the fourth control line 604 can be coupled to the fifth switch 610. In this case, the fifth switch 610 receives control signals to open or close using the fourth control line 604.

Example Methods

Figure 7:
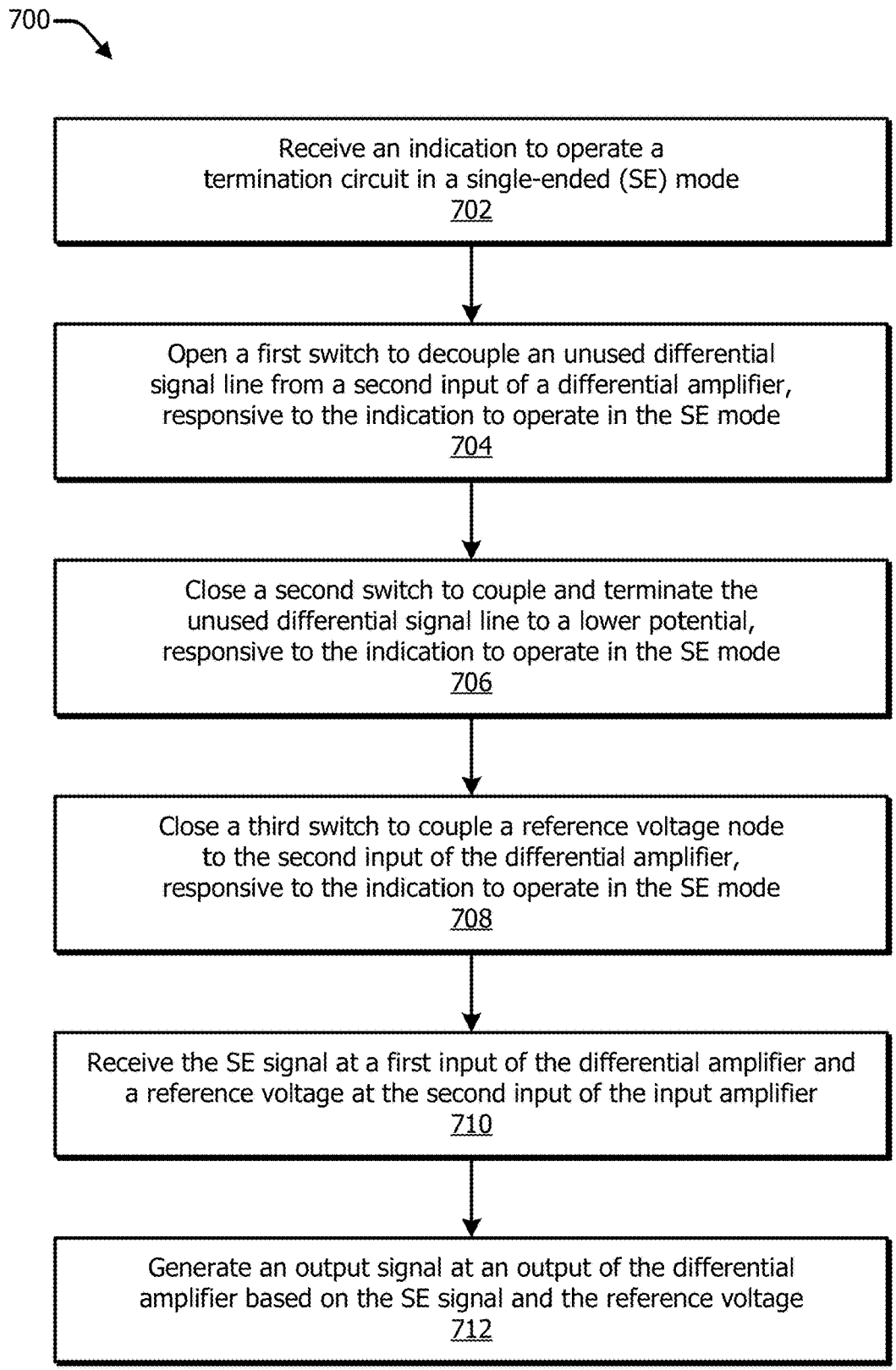
FIG. 7 illustrates an example method for terminating a clock line for SE mode operations in accordance with one or more aspects.
Figure 8:
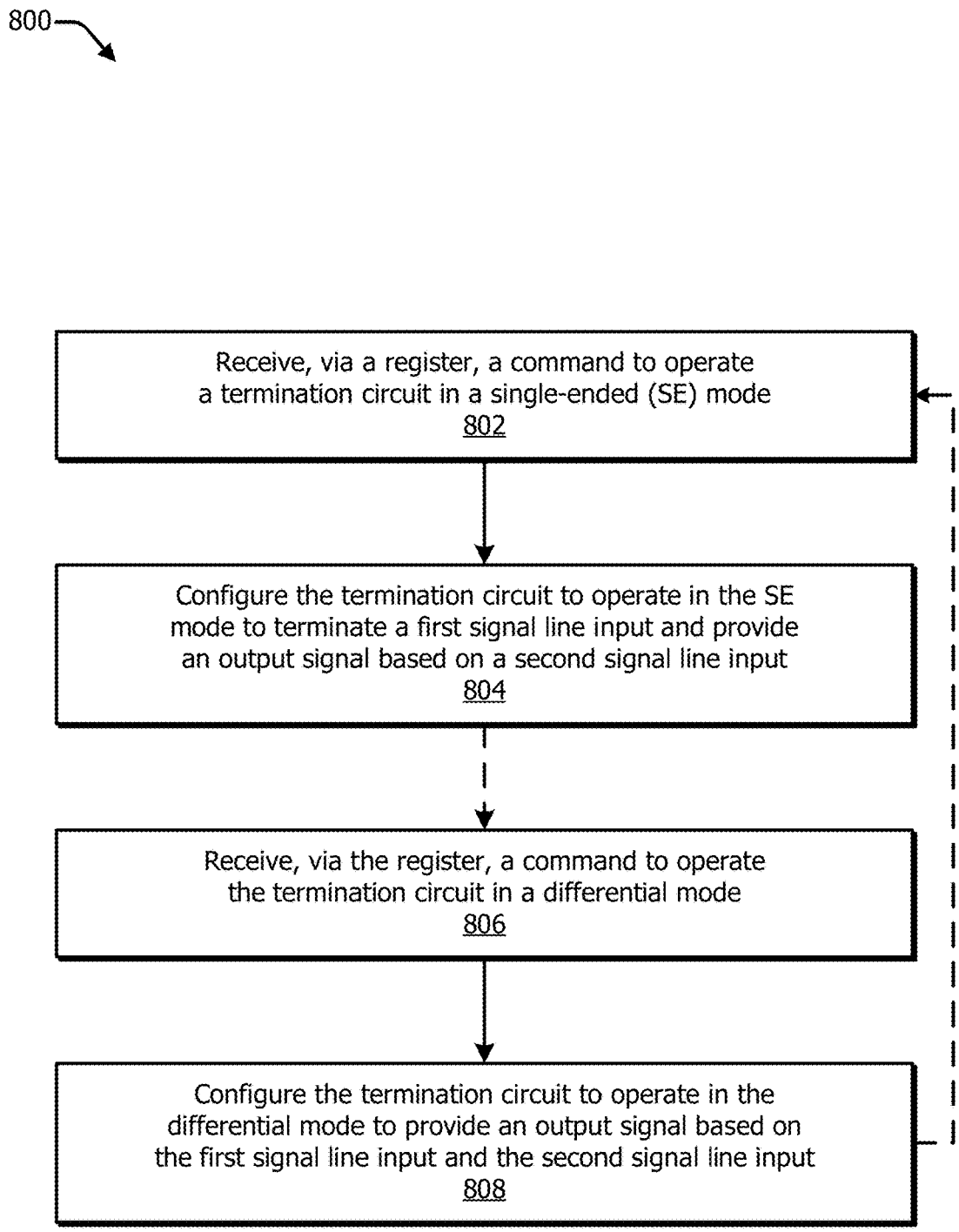
FIG. 8 illustrates an example method for configuring a termination circuit to operate in an SE mode or a differential mode in accordance with one or more aspects.
Figure 9:
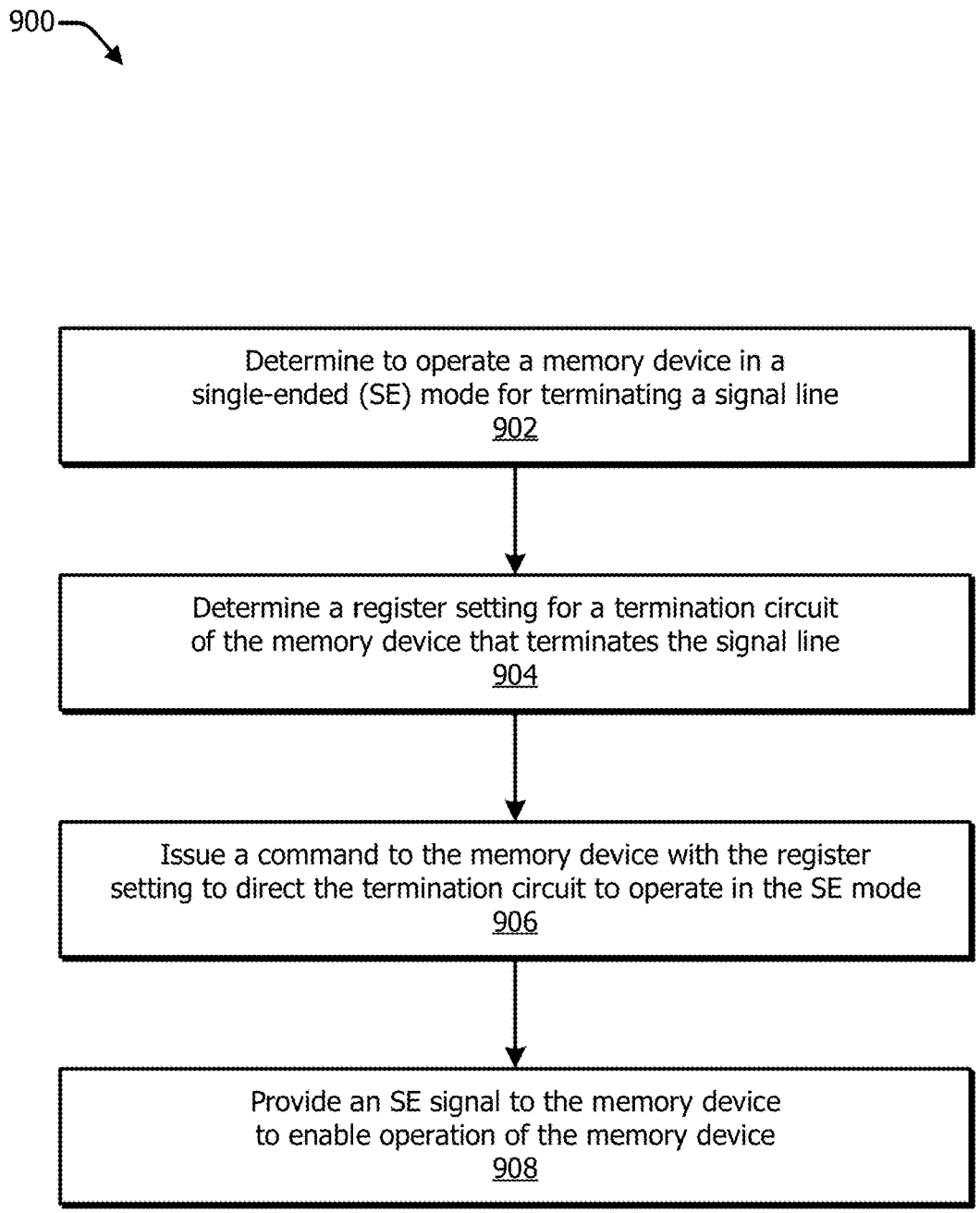
FIG. 9 illustrates an example method for directing a memory device to operate a termination circuit in an SE mode in accordance with one or more aspects.

FIGS. 7-9 illustrates example methods 700 through 900 for terminating a clock line for SE mode operations in accordance with one or more aspects. The operations of the methods 700 through 900 for terminating a clock line (e.g., high-impedance node) for SE mode operation may be implemented with any of the entities described with reference to FIGS. 1-6. Such reference is made by way of example only, and the described method operations are not necessarily limited to performance by one entity or multiple entities operating on a single device. Generally, the methods 700 through 900 are shown as sets of operations (or acts) performed and is not necessarily limited to the order or combinations in which the operations are shown herein. Furthermore, any of one or more of the operations can be repeated, combined, reorganized, or linked to provide a wide array of additional and/or alternative methods.

FIG. 7 illustrates an example method 700 for terminating a clock line for SE mode operations in accordance with one or more aspects. At 702, an indication is received to operate a circuit in an SE mode in which an SE signal is received at a first input of a differential amplifier. For example, a mode register 116 of a memory device 114 receives a command from a memory controller 108 to operate in an SE mode of signaling. In some cases, the indication to operate in the SE mode is in response to a power consumption profile of an apparatus 102 (e.g., computer) to conserve power or reduce power consumed in association with memory access. The mode register 116 can receive one or more commands regarding a mode of signaling from either the host device 104 (e.g., an SoC) or the memory device 114 (e.g., a DRAM). Based on the SE mode of operation, the clock generator 112 transmits the WCK_t signal 208 to the first input 302 of the differential amplifier 202. The mode register 116 and/or control logic of the memory device 114 may also generate or modify respective control signals to configure a termination circuit 118 for the SE mode of operation.

At 704, a first switch is opened to decouple an unused differential signal line from a second input of the differential amplifier based on the indication to operate in the SE mode. Control signals provided by the control logic 314 of the memory device 114 or an external source (e.g., the memory controller) may open a first switch of the termination circuit 118 shown in 300. For example, the first switch 310 is deactivated to open in response to control signals of the mode register 116, using the control logic 314. This may decouple the second signal line 312 from the second input 304 of the differential amplifier 202. When operating the memory device 114 in the SE mode, the second signal line 312 can be considered an unused differential signal line due to the absence of WCK signals.

At 706, a second switch is closed to couple and terminate the unused differential signal line to a lower potential based on the indication to operate in the SE mode. In some cases, the unused differential signal line is terminated through a termination resistor, which may have a configurable resistance (e.g., an ODT). In other cases, the unused differential signal line is terminated directly to ground or a reference node through a switch or transistor. The second switch may close in response to the control signals provided by the control logic 314 of the memory device 114 or the external source (e.g., the memory controller 108). For example, the second switch 322 is triggered to close by control signals of the mode register 116, using the control logic 314, which couples the second signal line 312 to the ground reference 320. The ground reference 320 can include a lower potential from which voltages are measured. By coupling or terminating the second signal line 312 to the ground reference 320, any residual current or charge (e.g., electrical noise) can be terminated to ground instead of influencing aspects of the memory device 114 (e.g., distorting WCK signals along the first signal line 308).

At 708, a third switch is closed to couple or apply a reference voltage to the second input of the differential amplifier based on the indication to operate in the SE mode. The third switch may close in response to the control signals provided by the control logic 314 of the memory device 114 or the external source (e.g., the memory controller 108). For example, the third switch 326 is triggered to close by control signals of the mode register 116, using the control logic 314, which couples the V$_{REF}$ 210 to the second input 304 of the differential amplifier 202. As described herein, the V$_{REF}$ 210 can be a reference voltage or a configurable reference based on a voltage divider circuit of the termination circuit 118 shown in 500.

At 710, an SE signal is received at the first input of the differential amplifier, while the reference voltage is applied at the second input of the differential amplifier. For example, based on commands sent to the mode register 116 and control signals generated by the control logic 314, the termination circuit 118 is configured such that an SE-mode version of the WCK_t signal 208 is received at the first input 302 of the differential amplifier 202 using the first signal line 308. Additionally, the V$_{REF}$ 210 is received at the second input 304 of the differential amplifier 202.

At 712, an output signal is generated at an output of the differential amplifier based on the SE signal and the reference voltage. For example, the differential amplifier 202 compares the voltage of the WCK_t signal 208, received at the first input 302, to the voltage of the V$_{REF}$ 210, received at the second input 304, and amplifies a voltage difference (e.g., generates an output signal). The voltage difference is transmitted using the output 306 to the control circuitry 120 and then the memory array 122.

FIG. 8 illustrates an example method 800 for configuring a termination circuit to operate in an SE mode or a differential mode in accordance with one or more aspects. At 802, a memory device receives, via a register, a command to operate a termination circuit in a single-ended (SE) mode. For example, bits of a mode register of the memory device may be set by a memory controller for the memory device to set one or more of its termination circuits (e.g., clock termination circuits) for SE mode operation.

At 804, the memory device configures the termination circuit to operate in the SE mode to terminate a first signal line (or signal line input) and provide an output signal based on a second signal line (or signal line input). For example, the memory device may configure circuit elements of the termination circuit as described with reference to the method 700 to enable SE mode operation of one or more differential signal pairs of the memory device.

Optionally at 806, the memory device receives, via the register, a command to operate the termination circuit in a differential mode. When configured to operate the termination circuit in SE mode operation, the memory device may receive a command to transition the termination circuit to a configuration for the differential mode operation. For example, the bits of the mode register of the memory device may be set by the memory controller for the memory device to set one or more of its termination circuits (e.g., clock termination circuits) for differential mode operation.

At 808, the memory device configures the termination circuit to operate in the differential mode to provide an output signal based on the first signal line (or signal line input) and the second signal line (or signal line input). For example, the memory device may reverse, invert, or undo respective configurations of the circuit elements of the termination circuit as described with reference to the method 700 to disable the SE mode operation and enable the differential mode for the one or more differential signal pairs of the memory device.

FIG. 9 illustrates an example method 900 for directing a memory device to operate a termination circuit in an SE mode in accordance with one or more aspects. At 902, a memory controller determines to operate a memory device in a single-ended (SE) mode for terminating a signal line. For example, the memory controller may determine to operate the memory device in a low-power mode, such as in response to an indication that a device in which the memory device is embodied is transitioning to a low-power mode.

At 904, the memory controller determines a register setting for a termination circuit of the memory device to terminate the signal line. For example, the memory controller may determine respective bit settings to configure at least one signal line of a differential pair for termination in accordance with aspects described herein. In some cases, the bit settings instruct the memory device to terminate a first signal line of the differential pair to a ground reference or a reference voltage, and leave a second signal line of the differential pair unterminated or terminated using a configurable termination resistor.

At 906, the memory controller issues a command to the memory device with the register setting to direct the termination circuit to operate in the SE mode. For example, the memory controller may issue a command to the memory device effective to set bit values of a mode register of the memory device that controls the termination circuit. Alternately or additionally, the memory controller may toggle, assert, or deassert a signal line to indicate to the memory device to operate the termination circuit in the SE mode.

At 908, the memory controller provides an SE signal to the memory device to enable operation of the memory device. For example, the memory controller may transition from a differential clock signaling mode to an SE clock signaling mode to provide an SE clock signal to the memory device. In some aspects, use of the SE clock signal may enable the memory device to operate with less power consumption, which may in turn reduce power consumption of an electronic device in which the memory device is implemented.

In the following, various examples of termination for single-ended mode are described:

Example 1: A circuit comprising: a differential amplifier having a first input, a second input, and an output, the output coupled to a clock circuit; a first signal line coupled to the first input of the differential amplifier; a first switch coupled between the second input of the differential amplifier and a second signal line, the first switch configured to selectively connect the second signal line to the second input of the differential amplifier; a first termination resistor having a first terminal coupled to the second signal line; a second switch coupled between a second terminal of the first termination resistor a ground, the second switch configured to selectively connect the first termination resistor that is coupled to the second signal line to the ground; and a third switch coupled between the second input of the differential amplifier and a reference voltage node, the third switch configured to selectively connect the reference voltage node to the second input of the differential amplifier.

Example 2: The circuit as recited by example 1 or any other example, further comprising one or more control lines coupled to respective control terminals of the first switch, the second switch, and the third switch, and wherein the circuit is configured to: receive, using the one or more control lines, control signals from control logic associated with the clock circuit; enable, responsive to a first set of the control signals, a differential signaling mode by closing the first switch to connect the second signal line to the second input of the differential amplifier, opening the second switch to disconnect the first termination resistor that is coupled to the second signal line from the ground, and opening the third switch to disconnect the reference voltage node from the second input of the differential amplifier; and enable, responsive to a second set of the control signals, a single-ended signaling mode by opening the first switch to disconnect the second signal line from the second input of the differential amplifier, closing the second switch to connect the first termination resistor that is coupled to the second signal line to the ground, and closing third switch to connect the reference voltage node to the second input of the differential amplifier.

Example 3: The circuit as recited by example 2 or any other example, wherein the one or more control lines comprises: a first control line coupled to a control terminal of the first switch; a second control line coupled to a control terminal of the second switch; and a third control line coupled to a control terminal of the third switch.

Example 4: The circuit as recited by example 3 or any other example, further comprising: an inverter coupled between the first control line and the control terminal of the first switch, the inverter configured to perform logical negation.

Example 5: The circuit as recited by example 4 or any other example, wherein the first control line is coupled to the control terminal of the second switch using the second control line, the second control line configured to provide a second control signal to the control terminal of the second switch based on a first control signal of the first control line.

Example 6: The circuit as recited by example 3 or any other example, wherein a first terminal of the third switch is coupled to the second input of the differential amplifier and a second terminal of the third switch is coupled to the reference voltage node, and the circuit further comprises: at least a first resistor coupled between the reference voltage node and the ground; at least a fourth switch coupled in parallel with the at least first resistor that is coupled between the reference voltage node and the ground; at least a second resistor coupled between the reference voltage node and a voltage rail; and at least a fifth switch coupled in parallel with the at least second resistor that is coupled between the reference voltage node and the voltage rail.

Example 7: The circuit as recited by example 6 or any other example, wherein: the at least a first resistor, the at least a fourth switch, the at least a second resistor, and the at least a fifth switch form a configurable voltage divider to provide an adjustable reference voltage to the reference voltage node.

Example 8: The circuit as recited by example 2 or any other example, further comprising: a fourth switch coupled between the first signal line and the first input of the differential amplifier, the fourth switch configured to selectively connect the first signal line to the first input of the differential amplifier; a second termination resistor having a first terminal coupled to the first signal line; a fifth switch coupled between a second terminal of the second termination resistor and the ground, the fifth switch configured to selectively connect the second termination resistor that is coupled to the first signal line to the ground; and a sixth switch coupled between the first input of the differential amplifier and the reference voltage node, the sixth switch configured to selectively connect the reference voltage node to the first input of the differential amplifier.

Example 9: The circuit as recited by example 8 or any other example, wherein: the first termination resistor is configured as an on-die termination for the second signal line; and the second termination resistor is configured as on-die termination for the first signal line.

Example 10: The circuit as recited by example 8 or any other example, wherein the one or more control lines are coupled to respective control terminals of the fourth switch, the fifth switch, and the sixth switch, and wherein the circuit is configured to: receive, using the one or more control lines, other control signals from the signal mode controller; enable, responsive to a first set of the other control signals, the differential signaling mode by closing the fourth switch to connect the first signal line to the first input of the differential amplifier, opening the fifth switch to disconnect the second termination resistor that is coupled to the first signal line from the ground, and opening the sixth switch to disconnect the reference voltage node from the first input of the differential amplifier; and enable, responsive to a second set of the other control signals, the single-ended signaling mode by opening the fourth switch to disconnect the first signal line from the first input of the differential amplifier, closing the fifth switch to connect the second termination resistor that is coupled to the first signal line to the ground, and closing sixth switch to connect the reference voltage node to the first input of the differential amplifier.

Example 11: The circuit as recited by example 10 or any other example, wherein the one or more control lines comprise: a fourth control line coupled to a control terminal of the fourth switch; a fifth control line coupled to a control terminal of the fifth switch; and a sixth control line coupled to a control terminal of the sixth switch.

Example 12: The circuit as recited by example 11 or any other example, further comprising: an inverter coupled between the control terminal of the fourth switch and the fourth control line, the second inverter configured to perform logical negation.

Example 13: The circuit as recited by example 12 or any other example, wherein the fourth control line is coupled to the control terminal of the fifth switch using the fifth control line, the fifth control line configured to provide a fourth control signal to the control terminal of the fifth switch based on a third control signal of the fourth control line.

Example 14: The circuit as recited by example 1 or any other example, wherein: the first signal line is configured as a true clock line; the second signal line is configured as a complementary clock line; and the true clock line and the complementary clock line are configured to enable operations of a memory device.

Example 15: The circuit as recited by example 1 or any other example, wherein: the first signal line is configured as a complementary clock line; the second signal line is configured as a true clock line; and the true clock line and the complementary clock line are configured to enable operations of a memory device.

Example 16: The circuit as recited by example 1 or any other example, wherein the first switch, the second switch, or the third switch comprises one or more of: a transmission gate; a field-effect transistor (FET); a metal-oxide-semiconductor field-effect transistor (MOSFET); pass-transistor logic; a diode; or a transistor.

Example 17: A memory device comprising: at least one memory array comprising multiple memory banks; an interface for a memory interconnect; control logic configured to enable access to the at least one memory array using the interface for the memory interconnect; and a termination circuit comprising: a differential amplifier having a first input coupled to a first clock line of the interface, a second input, and an output coupled to a clock input of the control logic; a first switch coupled between a second clock line of the interface and the second input of the differential amplifier, the first switch configured to selectively connect the second clock line to the second input of the differential amplifier; a first termination resistor having a first terminal coupled to the second clock line; a second switch coupled between a second terminal of the first termination resistor and a ground, the second switch configured to selectively connect the first termination resistor that is coupled to the second clock line to the ground; and a third switch coupled between the second input of the differential amplifier and a reference voltage node, the third switch configured to selectively connect the reference voltage node to the second input of the differential amplifier.

Example 18: The memory device as recited by example 17 or any other example, wherein the termination circuit further comprises one or more control lines coupled to respective control terminals of the first switch, the second switch, and the third switch, the one or more control signals configured to selectively control the termination circuit to implement: a differential mode of the termination circuit by closing the first switch to connect the second clock line to the second input of the differential amplifier, opening the second switch to disconnect the first termination resistor that is coupled to the second clock line from the ground, and opening the third switch to disconnect the reference voltage node from the second input of the differential amplifier; and a single-ended (SE) mode of the termination circuit by opening the first switch to disconnect the second clock line from the second input of the differential amplifier, closing the second switch connect the first termination resistor that is coupled to the second clock line to the ground, and closing the third switch connect the reference voltage node to the second input of the differential amplifier.

Example 19: The memory device as recited by example 17 or any other example, further comprising a mode register operably coupled to the interface and termination circuit control logic of the one or more control lines of the termination circuit, the mode register configured to: receive, using the interface, a command to operate the termination circuit in the differential mode or the SE mode; and configure, based on the command, the termination circuit control logic of the termination circuit to implement the differential mode of the termination circuit or the SE mode of the termination circuit.

Example 20: The memory device as recited by example 19 or any other example, wherein the mode register is further configured to receive, using the interface, the command from a memory controller coupled to the memory interconnect.

Example 21: The memory device as recited by example 20 or any other example, wherein the command received by the mode register from the memory controller indicates one of: a first termination resistor setting specific to the first clock line; a second termination resistor setting specific to the second clock line; or the first termination resistor setting specific to the first clock line and the second termination resistor setting for the second clock line.

Example 22: The memory device as recited by example 21 or any other example, wherein the command received from the memory controller is communicated in compliance with a Low-Power Double Data Rate (LPDDR) specification.

Example 23: The memory device as recited by example 17 or any other example, further comprising termination circuit control logic operably coupled to the one or more control lines of the termination circuit, the termination circuit control logic configured to: determine that the memory device is configured to operate in the differential mode or the SE mode; and configure, based on the determination, the one or more control lines of the termination circuit to implement the differential mode of the termination circuit or the SE mode of the termination circuit.

Example 24: The memory device as recited by example 17 or any other example, wherein a first terminal of the third switch is coupled to the second input of the differential amplifier and a second terminal of the third switch is coupled to the reference voltage node, and the termination circuit further comprises a voltage divider to provide the reference voltage, the voltage divider comparing: at least a first resistor coupled between the reference voltage node and the ground; at least a fourth switch coupled in parallel with the at least first resistor that is coupled between the reference voltage node and the ground; at least a second resistor coupled between the reference voltage node and a voltage rail; and at least a fifth switch coupled in parallel with the at least fourth resistor that is coupled between the reference voltage node and the voltage rail.

Example 25: The memory device as recited by example 17 or any other example, wherein the termination circuit further comprises: a fourth switch coupled between the first clock line and the first input of the differential amplifier, the fourth switch configured to selectively connect the first clock line to the first input of the differential amplifier; a second termination resistor having a first terminal coupled to the first clock line; a fifth switch coupled between a second terminal of the second termination resistor and the ground, the fifth switch configured to selectively connect the second termination resistor that is coupled to the first clock line to the ground; and a sixth switch coupled between the first input of the differential amplifier and the reference voltage node, the sixth switch configured to selectively connect the reference voltage node to the first input of the differential amplifier.

Example 26: The memory device as recited by example 25 or any other example, wherein: the first termination resistor is configured as an on-die termination for the second clock line; and the second termination resistor is configured as an on-die termination for the first clock line.

Example 27: The memory device as recited by example 17 or any other example, wherein: the first clock line and the second clock line are a respective true clock (CK_t) signal and a complementary clock (CK_c) signal of the memory interconnect; or the first clock line and the second clock line are a respective true write clock (WCK_t) signal and a complementary write clock (WCK_c) signal of the memory interconnect.

Example 28: A host device comprising: an interface for a memory interconnect; control logic configured to receive data from the memory interconnect; and a termination circuit comprising: a differential amplifier having a first input coupled to a first clock line of the interface, a second input, and an output coupled to a clock input of the control logic; a first switch coupled between a second clock line of the interface and the second input of the differential amplifier, the first switch configured to selectively connect the second clock line to the second input of the differential amplifier; a first termination resistor having a first terminal coupled to the second clock line; a second switch coupled between a second terminal of the first termination resistor and a ground, the second switch configured to selectively connect the first termination resistor that is coupled to the second clock line to the ground; and a third switch coupled between the second input of the differential amplifier and a reference voltage node, the third switch configured to selectively connect the reference voltage node to the second input of the differential amplifier.

Example 29: The host device as recited by example 28 or any other example, wherein the termination circuit further comprises one or more control lines coupled to respective control terminals of the first switch, the second switch, and the third switch, the one or more control signals operable to control the termination circuit to implement: a differential mode of the termination circuit by closing the first switch to connect the second clock line to the second input of the differential amplifier, opening the second switch to disconnect the first termination resistor that is coupled to the second clock line from the ground, and opening the third switch to disconnect the reference voltage node from the second input of the differential amplifier; and a single-ended (SE) mode of the termination circuit by opening the first switch to disconnect the second clock line from the second input of the differential amplifier, closing the second switch connect the first termination resistor that is coupled to the second clock line to the ground, and closing the third switch connect the reference voltage node to the second input of the differential amplifier.

Example 30: The host device as recited by example 28 or any other example, further comprising a mode controller operably coupled to termination circuit control logic of the one or more control lines of the termination circuit, the mode controller configured to: determine a rate at which to operate one or more clock signals of the memory interconnect; determine, based on the rate at which to operation the one or more clock signals, to operate the termination circuit in the differential mode or the SE mode; and configure, based on the command, the termination circuit control logic of the termination circuit to implement the differential mode of the termination circuit or the SE mode of the termination circuit.

Example 31: The host device as recited by example 28 or any other example, wherein the first clock line and second clock line of the memory interface operate in compliance with a Low Power Double Data Rate (LPDDR) specification.

Example 32: The host device as recited by example 28 or any other example, wherein a first terminal of the third switch is coupled to the second input of the differential amplifier and a second terminal of the third switch is coupled to the reference voltage node, and the termination circuit further comprises a voltage divider to provide the reference voltage, the voltage divider comparing: at least a first resistor coupled between the reference voltage node and the ground; at least a fourth switch coupled in parallel with the at least first resistor that is coupled between the reference voltage node and the ground; at least a second resistor coupled between the reference voltage node and a voltage rail; and at least a fifth switch coupled in parallel with the at least second resistor that is coupled between the reference voltage node and the voltage rail.

Example 33: The host device as recited by example 28 or any other example, wherein the termination circuit further comprises: a fourth switch coupled between the first clock line and the first input of the differential amplifier, the fourth switch configured to selectively connect the first clock line to the first input of the differential amplifier; a second termination resistor having a first terminal coupled to the first clock line; a fifth switch coupled between a second terminal of the first termination resistor and the ground, the fifth switch configured to selectively connect the second termination resistor that is coupled to the first clock line to the ground; and a sixth switch coupled between the first input of the differential amplifier and the reference voltage node, the sixth switch configured to selectively connect the reference voltage node to the first input of the differential amplifier.

Example 34: The host device as recited by example 33 or any other example, wherein: the first termination resistor is configured as an on-die termination for the second clock line; and the second termination resistor is configured as on-die termination for the first clock line.

Example 35: The host device as recited by example 28 or any other example, wherein: the first clock line and the second clock line are a respective true read data strobe (RDQS_t) signal and a complementary read data strobe (RDQS_c) signal of the memory interconnect.

Example 36: A method comprising: receiving an indication to operate a termination circuit of a memory clock in a single-ended (SE) mode; opening a first switch of the termination circuit to disconnect a first differential signal line from a first input of a differential amplifier of the termination circuit, responsive to the indication to operate in the SE mode; closing a second switch of the termination circuit to connect a first termination resistor that is coupled to the first differential signal line to a ground, responsive to the indication to operate in the SE mode; closing a third switch of the termination circuit to connect a reference voltage node to the first input of the differential amplifier, responsive to the indication to operate in the SE mode; receiving, via a second differential signal line, the SE signal at a second input of the differential amplifier; receiving, from the reference voltage node, a reference voltage at the first input of the differential amplifier; and generating, for the memory clock, an output signal at an output of the differential amplifier based on the SE signal and the reference voltage.

Example 37: The method as recited by example 36 or any other example, further comprising: comparing the SE signal to the reference voltage at the differential amplifier to provide a voltage difference; and amplifying the voltage difference using the differential amplifier, the output signal comprising the amplified voltage difference.

Example 38: The method as recited by example 36 or any other example, further comprising: receiving the indication to operate the termination circuit in the SE mode as a mode register command from a host device.

Example 39: The method as recited by example 36 or any other example, wherein: the mode register command includes at least two operands comprising: a first operand that specifies a termination setting for the first differential signal line; and a second operand that specifies a termination setting for the second differential signal line, the first operand being separate from the second operand.

Example 40: The method as recited by example 36 or any other example, further comprising: receiving a indication to operate the circuit in a differential mode; closing the first switch to connect the first differential signal line to the first input of the differential amplifier, responsive to the indication to operate in the differential mode; opening the second switch to disconnect the first termination resistor that is coupled to the first differential signal line from the ground, responsive to the indication to operate in the differential mode; opening the third switch to disconnect the reference voltage node from the first input of the differential amplifier, responsive to the indication to operate in the differential mode; receiving, via the first differential signal line, a first differential signal at the first input of the differential amplifier; receiving, via the second differential signal line, a second differential signal at the second input of the differential amplifier; and generating an output signal at the output of the differential amplifier based on the first differential signal and the second differential signal.

Example 41: The method as recited by example 36 or any other example, wherein: the second differential signal line comprises a true write clock (WCK_t) signal line and the first differential signal line comprises a complementary write clock (WCK_c) signal line of a memory device; or the second differential signal line comprises a true clock (CK_t) signal line and the first differential signal line comprises a complementary clock (CK_c) signal line of the memory device.

Example 42: A method comprising: receiving, via a register, a command to operate a termination circuit in a single-ended (SE) mode; configuring the termination circuit to operate in the SE mode to terminate a first signal line (or signal line input) and provide an output signal based on a second signal line (or signal line input); (optionally) receiving, via the register, a command to operate the termination circuit in a differential mode; and configuring the termination circuit to operate in the differential mode to provide an output signal based on the first signal line (or signal line input) and the second signal line (or signal line input).

Example 43: A method comprising determining (e.g., by a memory controller) to operate a memory device in a single-ended (SE) mode for terminating a signal line; determining a register setting for a termination circuit of the memory device to terminate the signal line; issuing a command to the memory device with the register setting to direct the termination circuit to operate in the SE mode; and providing an SE signal to the memory device to enable operation of the memory device.

Conclusion

Although aspects of termination for single-ended mode have been described in language specific to certain features and/or methods, the subject of the appended claims is not necessarily limited to the specific features or methods described. Rather, the specific features and methods are disclosed as a variety of example implementations of termination for single-ended mode.

What is claimed is:

1. A circuit comprising:
   a differential amplifier having a first input, a second input, and an output, the output coupled to a clock circuit of a memory device;
   a first clock line of a clock generator coupled to the first input of the differential amplifier;
   a first switch coupled between the second input of the differential amplifier and a second clock line of the clock generator, the first switch configured to selectively connect the second clock line to the second input of the differential amplifier;
   a first termination resistor having a first terminal coupled to the second clock line;
   a second switch coupled between a second terminal of the first termination resistor and a ground, the second switch configured to selectively connect the first termination resistor that is coupled to the second clock line to the ground; and
   a third switch coupled between the second input of the differential amplifier and a reference voltage node, the third switch configured to selectively connect the reference voltage node to the second input of the differential amplifier.

2. The circuit as recited by claim 1, further comprising one or more control lines coupled to respective control terminals of the first switch, the second switch, and the third switch, and wherein the circuit is configured to:
   receive, using the one or more control lines, control signals from control logic associated with the clock circuit;
   enable, responsive to a first set of the control signals, a differential signaling mode by closing the first switch to connect the second clock line to the second input of the differential amplifier, opening the second switch to disconnect the first termination resistor that is coupled to the second clock line from the ground, and opening the third switch to disconnect the reference voltage node from the second input of the differential amplifier; and
   enable, responsive to a second set of the control signals, a single-ended signaling mode by opening the first switch to disconnect the second clock line from the second input of the differential amplifier, closing the second switch to connect the first termination resistor that is coupled to the second clock line to the ground, and closing third switch to connect the reference voltage node to the second input of the differential amplifier.

3. The circuit as recited by claim 2, wherein the one or more control lines comprises:
   a first control line coupled to a control terminal of the first switch;
   a second control line coupled to a control terminal of the second switch; and
   a third control line coupled to a control terminal of the third switch.

4. The circuit as recited by claim 3, further comprising:
   an inverter coupled between the first control line and the control terminal of the first switch, the inverter configured to perform logical negation.

5. The circuit as recited by claim 4, wherein the first control line is coupled to the control terminal of the second switch using the second control line, the second control line configured to provide a second control signal to the control terminal of the second switch based on a first control signal of the first control line.

6. The circuit as recited by claim 3, wherein a first terminal of the third switch is coupled to the second input of the differential amplifier and a second terminal of the third switch is coupled to the reference voltage node, and the circuit further comprises:
   at least a first resistor coupled between the reference voltage node and the ground;
   at least a fourth switch coupled in parallel with the at least first resistor that is coupled between the reference voltage node and the ground;
   at least a second resistor coupled between the reference voltage node and a voltage rail; and
   at least a fifth switch coupled in parallel with the at least second resistor that is coupled between the reference voltage node and the voltage rail.

7. The circuit as recited by claim 6, wherein:
   the at least a first resistor, the at least a fourth switch, the at least a second resistor, and the at least a fifth switch form a configurable voltage divider to provide an adjustable reference voltage to the reference voltage node.

8. The circuit as recited by claim 2, further comprising:
   a fourth switch coupled between the first clock line and the first input of the differential amplifier, the fourth switch configured to selectively connect the first clock line to the first input of the differential amplifier;
   a second termination resistor having a first terminal coupled to the first clock line;
   a fifth switch coupled between a second terminal of the second termination resistor and the ground, the fifth switch configured to selectively connect the second termination resistor that is coupled to the first clock line to the ground; and
   a sixth switch coupled between the first input of the differential amplifier and the reference voltage node, the sixth switch configured to selectively connect the reference voltage node to the first input of the differential amplifier.

9. The circuit as recited by claim 8, wherein:
   the first termination resistor is configured as an on-die termination for the second clock line; and
   the second termination resistor is configured as on-die termination for the first clock line.

10. The circuit as recited by claim 8, wherein the one or more control lines are coupled to respective control terminals of the fourth switch, the fifth switch, and the sixth switch, and wherein the circuit is configured to:
    receive, using the one or more control lines, other control signals from the signal mode controller;
    enable, responsive to a first set of the other control signals, the differential signaling mode by closing the fourth switch to connect the first clock line to the first input of the differential amplifier, opening the fifth switch to disconnect the second termination resistor that is coupled to the first clock line from the ground, and opening the sixth switch to disconnect the reference voltage node from the first input of the differential amplifier; and enable, responsive to a second set of the other control signals, the single-ended signaling mode by opening the fourth switch to disconnect the first clock line from the first input of the differential amplifier, closing the fifth switch to connect the second termination resistor that is coupled to the first clock line to the ground, and closing sixth switch to connect the reference voltage node to the first input of the differential amplifier.

11. The circuit as recited by claim 10, wherein the one or more control lines comprise:

a fourth control line coupled to a control terminal of the fourth switch;

a fifth control line coupled to a control terminal of the fifth switch; and a sixth control line coupled to a control terminal of the sixth switch.

12. The circuit as recited by claim 11, further comprising:

an inverter coupled between the control terminal of the fourth switch and the fourth control line, the inverter configured to perform logical negation.

13. The circuit as recited by claim 12, wherein the fourth control line is coupled to the control terminal of the fifth switch using the fifth control line, the fifth control line configured to provide a fourth control signal to the control terminal of the fifth switch based on a third control signal of the fourth control line.

14. The circuit as recited by claim 1, wherein:

the first clock line is configured as a true clock line;

the second clock line is configured as a complementary clock line; and the true clock line and the complementary clock line are configured to enable operations of a memory device.

15. The circuit as recited by claim 1, wherein:

the first clock line is configured as a complementary clock line;

the second clock line is configured as a true clock line; and the true clock line and the complementary clock line are configured to enable operations of a memory device.

16. The circuit as recited by claim 1, wherein the first switch, the second switch, or the third switch comprises one or more of:

a transmission gate;
a field-effect transistor (FET);
a metal-oxide-semiconductor field-effect transistor (MOSFET);
pass-transistor logic;
a diode; or
a transistor.

17. A memory device comprising:

at least one memory array comprising multiple memory banks;

an interface for a memory interconnect;

control logic configured to enable access to the at least one memory array using the interface for the memory interconnect; and a termination circuit comprising:

a differential amplifier having a first input coupled to a first clock line of the interface, a second input, and an output coupled to a clock input of the control logic;

a first switch coupled between a second clock line of the interface and the second input of the differential amplifier, the first switch configured to selectively connect the second clock line to the second input of the differential amplifier;

a first termination resistor having a first terminal coupled to the second clock line;

a second switch coupled between a second terminal of the first termination resistor and a ground, the second switch configured to selectively connect the first termination resistor that is coupled to the second clock line to the ground; and a third switch coupled between the second input of the differential amplifier and a reference voltage node, the third switch configured to selectively connect the reference voltage node to the second input of the differential amplifier.

18. The memory device as recited by claim 17, wherein the termination circuit further comprises one or more control lines coupled to respective control terminals of the first switch, the second switch, and the third switch, the one or more control lines configured to selectively control the termination circuit to implement:

a differential mode of the termination circuit by closing the first switch to connect the second clock line to the second input of the differential amplifier, opening the second switch to disconnect the first termination resistor that is coupled to the second clock line from the ground, and opening the third switch to disconnect the reference voltage node from the second input of the differential amplifier; and a single-ended (SE) mode of the termination circuit by opening the first switch to disconnect the second clock line from the second input of the differential amplifier, closing the second switch connect the first termination resistor that is coupled to the second clock line to the ground, and closing the third switch connect the reference voltage node to the second input of the differential amplifier.

19. The memory device as recited by claim 18, further comprising a mode register operably coupled to the interface and termination circuit control logic of the one or more control lines of the termination circuit, the mode register configured to:

receive, using the interface, a command to operate the termination circuit in the differential mode or the SE mode; and configure, based on the command, the termination circuit control logic of the termination circuit to implement the differential mode of the termination circuit or the SE mode of the termination circuit.

20. The memory device as recited by claim 19, wherein the mode register is further configured to receive, using the interface, the command from a memory controller coupled to the memory interconnect.

21. The memory device as recited by claim 20, wherein the command received by the mode register from the memory controller indicates one of:

a first termination resistor setting specific to the first clock line;

a second termination resistor setting specific to the second clock line; or the first termination resistor setting specific to the first clock line and the second termination resistor setting for the second clock line.

22. The memory device as recited by claim 21, wherein the command received from the memory controller is communicated in compliance with a Low-Power Double Data Rate (LPDDR) specification.

23. The memory device as recited by claim 18, further comprising termination circuit control logic operably coupled to the one or more control lines of the termination circuit, the termination circuit control logic configured to:
   determine that the memory device is configured to operate in the differential mode or the SE mode; and
   configure, based on the determination, the one or more control lines of the termination circuit to implement the differential mode of the termination circuit or the SE mode of the termination circuit.

24. The memory device as recited by claim 17, wherein a first terminal of the third switch is coupled to the second input of the differential amplifier and a second terminal of the third switch is coupled to the reference voltage node, and the termination circuit further comprises a voltage divider to provide the reference voltage, the voltage divider comparing:
   at least a first resistor coupled between the reference voltage node and the ground;
   at least a fourth switch coupled in parallel with the at least first resistor that is coupled between the reference voltage node and the ground;
   at least a second resistor coupled between the reference voltage node and a voltage rail; and
   at least a fifth switch coupled in parallel with the at least fourth resistor that is coupled between the reference voltage node and the voltage rail.

25. The memory device as recited by claim 17, wherein the termination circuit further comprises:
   a fourth switch coupled between the first clock line and the first input of the differential amplifier, the fourth switch configured to selectively connect the first clock line to the first input of the differential amplifier;
   a second termination resistor having a first terminal coupled to the first clock line;
   a fifth switch coupled between a second terminal of the second termination resistor and the ground, the fifth switch configured to selectively connect the second termination resistor that is coupled to the first clock line to the ground; and
   a sixth switch coupled between the first input of the differential amplifier and the reference voltage node, the sixth switch configured to selectively connect the reference voltage node to the first input of the differential amplifier.

26. The memory device as recited by claim 25, wherein:
   the first termination resistor is configured as an on-die termination for the second clock line; and
   the second termination resistor is configured as an on-die termination for the first clock line.

27. The memory device as recited by claim 17, wherein:
   the first clock line and the second clock line are a respective true clock (CK_t) signal and a complementary clock (CK_c) signal of the memory interconnect; or
   the first clock line and the second clock line are a respective true write clock (WCK_t) signal and a complementary write clock (WCK_c) signal of the memory interconnect.

28. A host device comprising:
   an interface for a memory interconnect;
   control logic configured to receive data from the memory interconnect; and
   a termination circuit comprising:
      a differential amplifier having a first input coupled to a first clock line of the interface, a second input, and an output coupled to a clock input of the control logic;
      a first switch coupled between a second clock line of the interface and the second input of the differential amplifier, the first switch configured to selectively connect the second clock line to the second input of the differential amplifier;
      a first termination resistor having a first terminal coupled to the second clock line;
      a second switch coupled between a second terminal of the first termination resistor and a ground, the second switch configured to selectively connect the first termination resistor that is coupled to the second clock line to the ground; and
      a third switch coupled between the second input of the differential amplifier and a reference voltage node, the third switch configured to selectively connect the reference voltage node to the second input of the differential amplifier.

29. The host device as recited by claim 28, wherein the termination circuit further comprises one or more control lines coupled to respective control terminals of the first switch, the second switch, and the third switch, the one or more control lines operable to control the termination circuit to implement:
   a differential mode of the termination circuit by closing the first switch to connect the second clock line to the second input of the differential amplifier, opening the second switch to disconnect the first termination resistor that is coupled to the second clock line from the ground, and opening the third switch to disconnect the reference voltage node from the second input of the differential amplifier; and
   a single-ended (SE) mode of the termination circuit by opening the first switch to disconnect the second clock line from the second input of the differential amplifier, closing the second switch connect the first termination resistor that is coupled to the second clock line to the ground, and closing the third switch connect the reference voltage node to the second input of the differential amplifier.

30. The host device as recited by claim 29, further comprising a mode controller operably coupled to termination circuit control logic of the one or more control lines of the termination circuit, the mode controller configured to:
   determine a rate at which to operate one or more clock signals of the memory interconnect;
   determine, based on the rate at which to operation the one or more clock signals, to operate the termination circuit in the differential mode or the SE mode; and
   configure the termination circuit control logic of the termination circuit to implement the differential mode of the termination circuit or the SE mode of the termination circuit.

31. The host device as recited by claim 28, wherein the first clock line and second clock line of the memory interface operate in compliance with a Low Power Double Data Rate (LPDDR) specification.

32. The host device as recited by claim 28, wherein a first terminal of the third switch is coupled to the second input of the differential amplifier and a second terminal of the third switch is coupled to the reference voltage node, and the termination circuit further comprises a voltage divider to provide the reference voltage, the voltage divider comparing:
   at least a first resistor coupled between the reference voltage node and the ground;

at least a fourth switch coupled in parallel with the at least first resistor that is coupled between the reference voltage node and the ground;

at least a second resistor coupled between the reference voltage node and a voltage rail; and at least a fifth switch coupled in parallel with the at least second resistor that is coupled between the reference voltage node and the voltage rail.

33. The host device as recited by claim 28, wherein the termination circuit further comprises:

a fourth switch coupled between the first clock line and the first input of the differential amplifier, the fourth switch configured to selectively connect the first clock line to the first input of the differential amplifier;

a second termination resistor having a first terminal coupled to the first clock line;

a fifth switch coupled between a second terminal of the first termination resistor and the ground, the fifth switch configured to selectively connect the second termination resistor that is coupled to the first clock line to the ground; and a sixth switch coupled between the first input of the differential amplifier and the reference voltage node, the sixth switch configured to selectively connect the reference voltage node to the first input of the differential amplifier.

34. The host device as recited by claim 33, wherein:

the first termination resistor is configured as an on-die termination for the second clock line; and the second termination resistor is configured as an on-die termination for the first clock line.

35. The host device as recited by claim 28, wherein:

the first clock line and the second clock line are a respective true read data strobe (RDQS_t) signal and a complementary read data strobe (RDQS_c) signal of the memory interconnect.

36. A method comprising:

receiving an indication to operate a termination circuit of a memory clock in a single-ended (SE) mode;

opening a first switch of the termination circuit to disconnect a first differential signal line from a first input of a differential amplifier of the termination circuit, responsive to the indication to operate in the SE mode;

closing a second switch of the termination circuit to connect a first termination resistor that is coupled to the first differential signal line to a ground, responsive to the indication to operate in the SE mode;

closing a third switch of the termination circuit to connect a reference voltage node to the first input of the differential amplifier, responsive to the indication to operate in the SE mode;

receiving, via a second differential signal line, the SE signal at a second input of the differential amplifier;

receiving, from the reference voltage node, a reference voltage at the first input of the differential amplifier; and generating, for the memory clock, an output signal at an output of the differential amplifier based on the SE signal and the reference voltage.

37. The method as recited by claim 36, further comprising:

comparing the SE signal to the reference voltage at the differential amplifier to provide a voltage difference; and amplifying the voltage difference using the differential amplifier, the output signal comprising the amplified voltage difference.

38. The method as recited by claim 36, further comprising:

receiving the indication to operate the termination circuit in the SE mode as a mode register command from a host device.

39. The method as recited by claim 38, wherein:

the mode register command includes at least two operands comprising:

a first operand that specifies a termination setting for the first differential signal line; and a second operand that specifies a termination setting for the second differential signal line, the first operand being separate from the second operand.

40. The method as recited by claim 36, further comprising:

receiving a indication to operate the circuit in a differential mode;

closing the first switch to connect the first differential signal line to the first input of the differential amplifier, responsive to the indication to operate in the differential mode;

opening the second switch to disconnect the first termination resistor that is coupled to the first differential signal line from the ground, responsive to the indication to operate in the differential mode;

opening the third switch to disconnect the reference voltage node from the first input of the differential amplifier, responsive to the indication to operate in the differential mode;

receiving, via the first differential signal line, a first differential signal at the first input of the differential amplifier;

receiving, via the second differential signal line, a second differential signal at the second input of the differential amplifier; and generating an output signal at the output of the differential amplifier based on the first differential signal and the second differential signal.

41. The method as recited by claim 36, wherein:

the second differential signal line comprises a true write clock (WCK_t) signal line and the first differential signal line comprises a complementary write clock (WCK_c) signal line of a memory device; or the second differential signal line comprises a true clock (CK_t) signal line and the first differential signal line comprises a complementary clock (CK_c) signal line of the memory device.

* * * * *